US008845040B2

(12) United States Patent
Yang et al.

(10) Patent No.: US 8,845,040 B2
(45) Date of Patent: Sep. 30, 2014

(54) HOUSING FOR AN ELECTRONIC DEVICE

(71) Applicant: Wistron Corporation, New Taipei (TW)

(72) Inventors: Chun Fei Yang, New Taipei (TW); Jung Chun Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 48 days.

(21) Appl. No.: 13/655,617

(22) Filed: Oct. 19, 2012

(65) Prior Publication Data

US 2014/0111068 A1    Apr. 24, 2014

Related U.S. Application Data

(62) Division of application No. 12/798,563, filed on Apr. 7, 2010, now Pat. No. 8,322,801.

(30) Foreign Application Priority Data

Aug. 25, 2009  (TW) ................................ 98128521 A

(51) Int. Cl.
*A47B 97/00*    (2006.01)
(52) U.S. Cl.
USPC ........................ 312/223.2; 312/222
(58) Field of Classification Search
USPC ............... 312/223.2, 223.1, 222; 361/679.02, 361/679.57; 292/137, 163, 175, 145, 292/DIG. 11, DIG. 13
See application file for complete search history.

(56) References Cited

U.S. PATENT DOCUMENTS

| 5,688,030 | A | * | 11/1997 | McAnally et al. | 312/223.2 |
| 5,921,516 | A | * | 7/1999 | Ho | 248/206.5 |
| 7,303,424 | B2 | * | 12/2007 | Tu et al. | 439/372 |
| 8,322,801 | B2 | * | 12/2012 | Yang et al. | 312/223.2 |
| 8,651,592 | B1 | * | 2/2014 | Yang et al. | 312/223.2 |
| 2005/0009588 | A1 | | 1/2005 | Qin et al. | |
| 2005/0037717 | A1 | | 2/2005 | Lin et al. | |
| 2005/0136995 | A1 | * | 6/2005 | Robertson | 455/575.1 |

(Continued)

FOREIGN PATENT DOCUMENTS

TW    M244662    7/1992

OTHER PUBLICATIONS

Official Action dated Aug. 22, 2012 issued to Chinese counterpart Application No. 200910170168.6; five (5) pages.

(Continued)

*Primary Examiner* — Daniel Rohrhoff
(74) *Attorney, Agent, or Firm* — John A. Fortkort; Fortkort & Houston P.C.

(57) ABSTRACT

A housing for an electronic device includes a housing body, a bottom cover, and a locking member. The housing body includes an engaging slot and a through hole. The bottom cover includes an engaging hook for engaging the engaging slot. An inner surface of the housing body or the bottom cover is provided with a positioning element. The locking member extends through the through hole, and includes an engaging portion disposed on the inner surface of the housing body, and a control portion exposed from the through hole. The control portion is operable to move the engaging portion between a locking position where the engaging portion engages the positioning element and an unlocking position where the engaging portion is separated from the positioning element to thereby facilitate assembly and disassembly of the bottom cover to and from the housing body.

3 Claims, 22 Drawing Sheets

(56) References Cited

U.S. PATENT DOCUMENTS

| | | |
|---|---|---|
| 2006/0154136 A1* | 7/2006 | Ge et al. .......................... 429/97 |
| 2007/0109737 A1* | 5/2007 | Kriege et al. ................. 361/683 |
| 2009/0040710 A1 | 2/2009 | Chung |
| 2010/0201235 A1* | 8/2010 | Chen et al. ................. 312/223.1 |
| 2011/0050056 A1* | 3/2011 | Yang et al. ................. 312/223.1 |
| 2011/0304246 A1* | 12/2011 | Taniguchi et al. ......... 312/223.1 |

OTHER PUBLICATIONS

Abridged English translation of Official Action dated Aug. 22, 2012 for Chinese counterpart Application No. 200910170168.6; five (5) pages.

Taiwan Office Action dated Jun. 27, 2011 in re Taiwanese Patent Application No. 098128521; 11 pages.

Abridged English translation of Taiwan Office Action dated Jun. 27, 2011 for Taiwanese Patent Application No. 098128521; 7 pages.

Abridged English translation of relevant section of TW M244662 published Jul. 23, 1992; 1 page.

Office Action dated Dec. 19, 2011 in re Chinese counterpart CN 200910170168.6; 32 pages.

Abridged English translation of CN Office Action dated Dec. 19, 2011 in re Chinese counterpart CN 200910170168.6; 3 pages.

Reference cited in Dec. 19, 2011 Office Action for counterpart CN 200910170168.6; TW Utility Model M244662; 27 pages.

English Abstract of TW Utility Model M244662; 3 pages.

\* cited by examiner

HOUSING FOR AN ELECTRONIC DEVICE

CROSS-REFERENCE TO RELATED APPLICATION

This application is a divisional application of and claims priority to U.S. patent application Ser. No. 12/798,563, now allowed, having the same inventors, and the same title, and which is incorporated herein by reference in its entirety; and which application claims the priority of Taiwanese Application No. 098128521, filed on Aug. 25, 2009.

BACKGROUND OF THE INVENTION

1. Field of the Invention

The invention relates to a housing for an electronic device, more particularly to a locking structure disposed between a housing body of a housing of an electronic device and a bottom cover of the electronic device.

2. Description of the Related Art

A conventional notebook computer generally has a plurality of accommodation slots that open downwardly and that are provided in a housing body of a housing thereof, and a plurality of covers that correspondingly and respectively cover the accommodation slots. The accommodation slots are disposed for receiving electronic components, such as hard disks (HDDs), memory modules, etc. The covers are fastened removably to the housing body to close respective openings of the accommodation slots.

In a housing 1 of a notebook computer shown in FIGS. 1 and 2, a housing body 11 of the housing 1 is provided with an accommodation slot 111 with a downward opening, a plurality of engaging slots 112 disposed at a periphery of the accommodation slot 111, and two screw holes 113 disposed at one side of the accommodation slot 111. A cover 12 has an inner surface provided with a plurality of engaging hooks 121 that correspond in position to the engaging slots 112, respectively, and two through holes 122 that correspond in position to the screw holes 113, respectively. When it is desired to assemble the cover 12 to the housing body 11, an operator needs to bring the engaging hooks 121 of the cover 12 into engagement with the engaging slots 112 of the housing body 11, respectively. Subsequently, screws 13 are passed through the through holes 122 and are driven into the respective screw holes 113 using a tool (such as a screwdriver) to thereby accomplish assembly of the cover 12. In addition, when it is desired to detach the cover 12 from the housing body 11, the screws 13 are loosened so as to be disengaged from the respective screw holes 113, and the engaging hooks 121 are subsequently detached from the respective engaging slots 112 to permit removal of the cover 12 from the housing body 11.

Since the accommodation slot 111 of the housing body 11 and the cover 12 are designed to be several in number, such a method of fastening using the screws 13 will not only cause inconvenience in assembly or disassembly, there is also an increase in assembly and disassembly time. Therefore, to devise a screwless locking structure that facilitates assembly and disassembly is the subject of improvement of the present invention.

SUMMARY OF THE INVENTION

An object of the present invention is to provide a housing for an electronic device, which includes a locking member that can be caused to slide or rotate so as to facilitate locking or detachment of a bottom cover to or from a housing body.

Another object of the present invention is to provide a housing for an electronic device, which has a screwless locking member that can facilitate locking or detachment of a bottom cover to or from a housing body.

The objects of this invention and solutions to the technical problems associated with the prior art are realized using the following technical means. The housing for an electronic device according to the present invention includes a housing body, a bottom cover, and a locking member.

The housing body includes an engaging slot disposed adjacent to a front end thereof, and a through hole disposed adjacent to a rear end thereof. The bottom cover includes an engaging hook disposed adjacent to a front end thereof for engaging the engaging slot. One of the housing body and the bottom cover is provided with a positioning element disposed on an inner surface adjacent to the front end thereof. The locking member extends through the through hole, and includes an engaging portion disposed on the inner surface of the housing body, and a control portion exposed from the through hole. The control portion is operable to cause the engaging portion to move between a locking position where the engaging portion engages the positioning element and an unlocking position where the engaging portion is separated from the positioning element.

The objects of the present invention and the solutions to the technical problems associated with the prior art may be further realized by adopting the following technical means.

In the aforementioned housing for the electronic device, the locking member includes a locking plate having the engaging portion, and a control button coupled detachably to the locking plate and having the control portion. The control button is operable to cause the locking plate to slide between the locking position and the unlocking position. By means of the locking member that includes two components which are coupled detachably, the locking plate disposed within the housing body can be brought to slide when a user operates the control button from the exterior of the bottom cover or from the exterior of the housing body.

In the aforementioned housing for an electronic device, the locking plate includes an engaging hole corresponding in position to the through hole. The control button includes two spaced-apart positioning hooks that extend through the through hole and the engaging hole, and that engage the locking plate. Thus, the control button can be coupled firmly to the locking plate.

In the aforementioned housing for an electronic device, the positioning element is disposed to project from the inner surface of the housing body, the bottom cover further includes a through bore corresponding in position to the through hole, the two positioning hooks extend through the through bore and the engaging hole, and the control portion is disposed on an outer surface of the bottom cover. Thus, the control button can be coupled to both the bottom cover and the locking plate to cause the locking plate to be engaged with the positioning element on the outer surface of the housing body.

In the aforementioned housing for an electronic device, the bottom cover further includes two first limiting indentations disposed adjacent to the rear end thereof, and two second limiting indentations disposed adjacent to the front end thereof. Each of the positioning hooks includes a limiting rib to engage a respective one of the first limiting indentations or a respective one of the second limiting indentations so as to position the locking member at one of the unlocking and locking positions.

In the aforementioned housing for an electronic device, the locking plate further includes two engaging indentations. The limiting rib of each of the positioning hooks engages a respective one of the engaging indentations.

In the aforementioned housing for an electronic device, the control portion is provided with a receiving groove having a downward opening. The housing further includes a rubber element retained in the receiving groove for abutting against a planar surface. Thus, the control button may serve as a support leg.

In the aforementioned housing for an electronic device, the positioning element is disposed to project from the inner surface of the bottom cover, and has an inverted L-shape. The housing body further includes a bottom wall that defines the engaging slot, and a sidewall that extends upwardly from a rear side end of the bottom wall and that defines the through hole. The bottom wall includes an aperture for extension of the positioning element therethrough. The control portion is disposed on an outer surface of the sidewall so as to facilitate operation of the control button by the user from the rear end of the housing body.

In the aforementioned housing for an electronic device, the bottom wall has an inner wall surface provided with a first limiting block, and a second limiting block disposed between the first limiting block and the positioning element. The locking plate further includes a limiting hook for engaging one of the first limiting block and the second limiting block so as to position the locking member at the unlocking position or the locking position.

In the aforementioned housing for an electronic device, the sidewall further includes a slide groove in spatial communication with the through hole for receiving the control portion. The control portion is slidable along the slide groove to cause the locking plate to slide between the locking position and the unlocking position.

In the aforementioned housing for an electronic device, the positioning element is disposed to project from the inner surface of the housing body, and the bottom cover further includes a through bore corresponding in position to the through hole. The locking member further includes a post projecting from the control portion and extending through the through bore and the through hole. The engaging portion is formed on an outer surface of the post and is exposed from the through hole. The control portion is disposed on the outer surface of the bottom cover, and is operable to cause the engaging portion to rotate between the locking position and the unlocking position.

In the aforementioned housing for an electronic device, the positioning element includes an engaging block. The engaging portion includes an engaging indentation for engaging the engaging block.

In the aforementioned housing for an electronic device, the inner surface of the housing body is further provided with a limiting element for abutment by the engaging portion so as to limit a rotational angle of the engaging portion, such that the engaging portion can be positioned at the locking position.

In the aforementioned housing for an electronic device, the inner surface of the housing body is further provided with a stop element that is spaced apart from the limiting element and that is for abutment by the engaging portion. The stop element serves to limit a rotational direction of the engaging portion, so that the locking member is operable to cause the engaging portion to rotate only in a single direction to the locking position.

In the aforementioned housing for an electronic device, the engaging portion further includes a guiding sloping surface for contacting an edge of the through hole. Thus, if the engaging portion is not fully exposed from a top end of the through hole, the engaging portion may still be guided by the guiding sloping surface to rotate to the inner surface of the housing body.

In the aforementioned housing for an electronic device, due to the arrangement of the locking member which can be slid or rotated between the locking position and the unlocking position, the bottom cover can be easily assembled and locked to the housing body or detached from the housing body, thereby providing a screwless locking structure that not only enhances convenience of assembly or disassembly but also reduces disassembly time.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
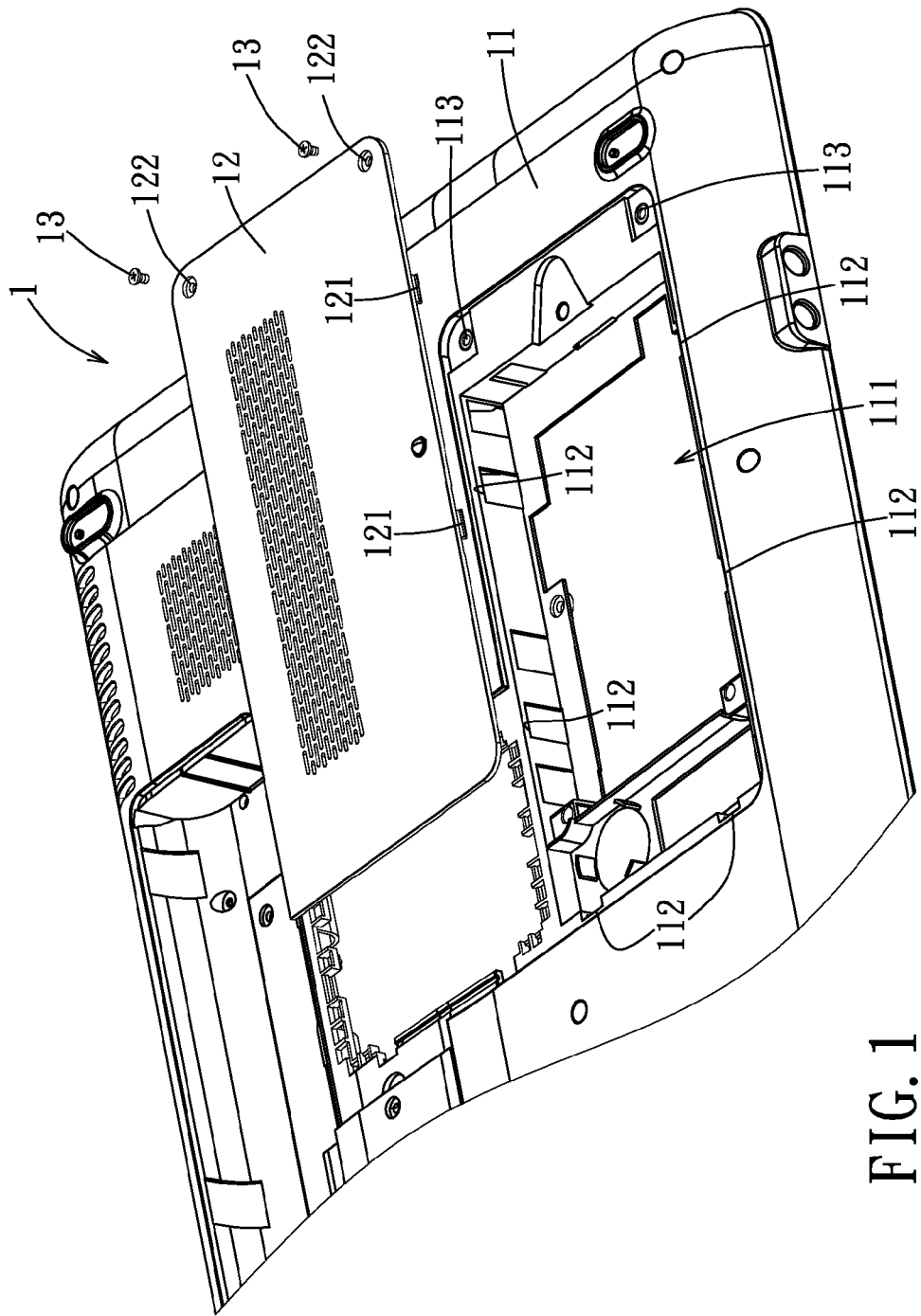
FIG. 1 is a fragmentary exploded perspective view of a housing for a conventional notebook computer to illustrate the assembly relationship between a housing body and a cover.
Figure 2:
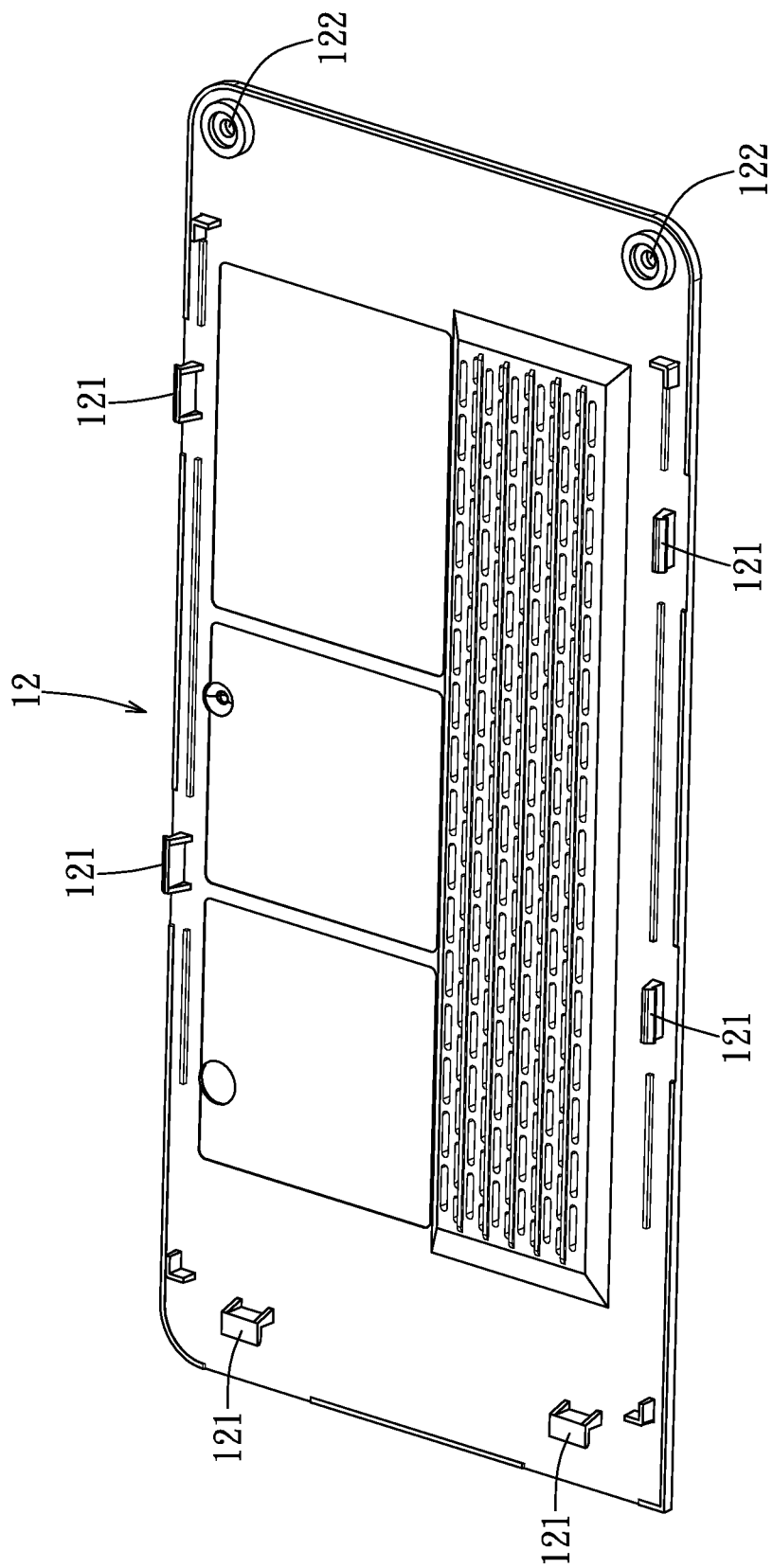
FIG. 2 is a perspective view of the cover of the housing for the conventional notebook computer.

Before the present invention is described in greater detail, it should be noted that like elements are denoted by the same reference numerals throughout the disclosure.

Through a description of the preferred embodiments, the technical means employed by the present invention to achieve the intended objects, and the advantageous effects contemplated thereby, can be better understood and appreciated. It is noted that the accompanying drawings are for illustration and reference only, and are not intended to limit the scope of the present invention.

Figure 3:
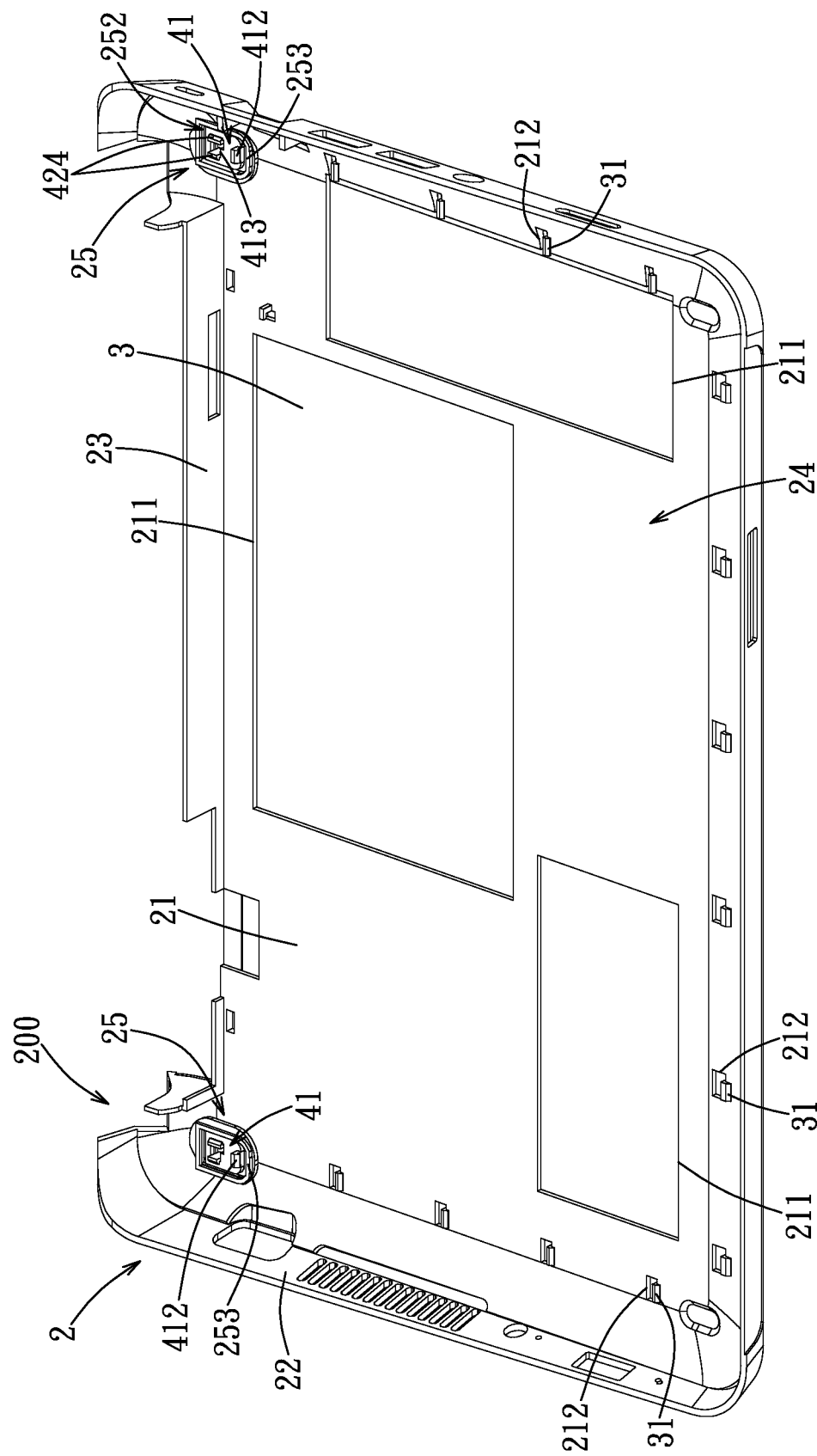
FIG. 3 is a perspective view of the first preferred embodiment of a housing for an electronic device according to the present invention, illustrating engaging portions of locking members in an unlocking position.
Figure 4:
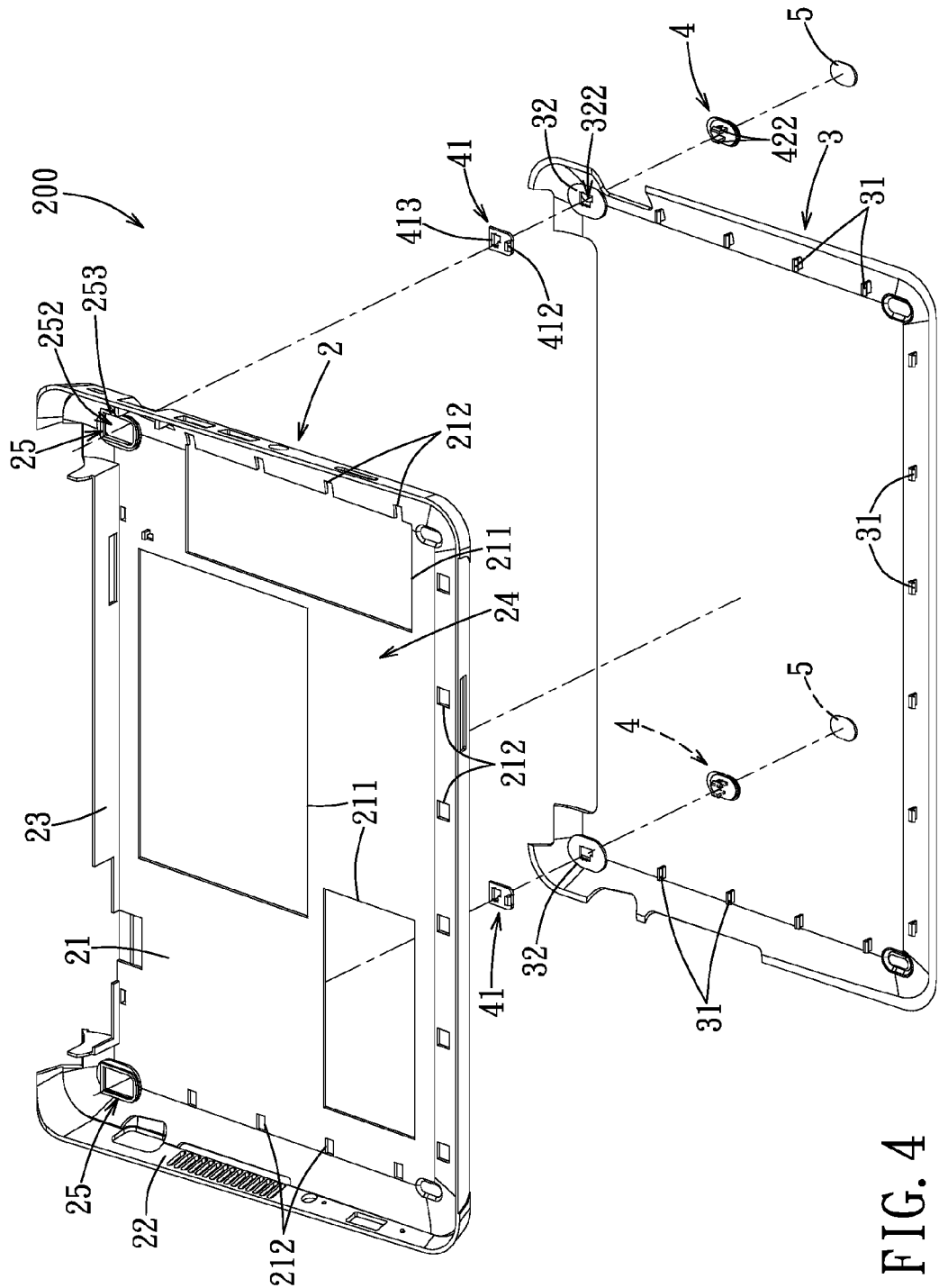
FIG. 4 is an exploded perspective view of the first preferred embodiment of the housing for an electronic device according to the present invention, illustrating the assembly relationships among a housing body, a bottom cover, and the locking members.

FIGS. 3 and 4 illustrate the first preferred embodiment of a housing 200 for an electronic device according to the present invention. The electronic device is exemplified to be a notebook computer. The housing 200 of the electronic device includes a housing body 2, a bottom cover 3 for covering a bottom face of the housing body 2, and at least one locking member 4 for locking the bottom cover 3 to the housing body 2. Certainly, the electronic device may be a desk-top computer, a digital audio-video player, or a server.

Figure 5:
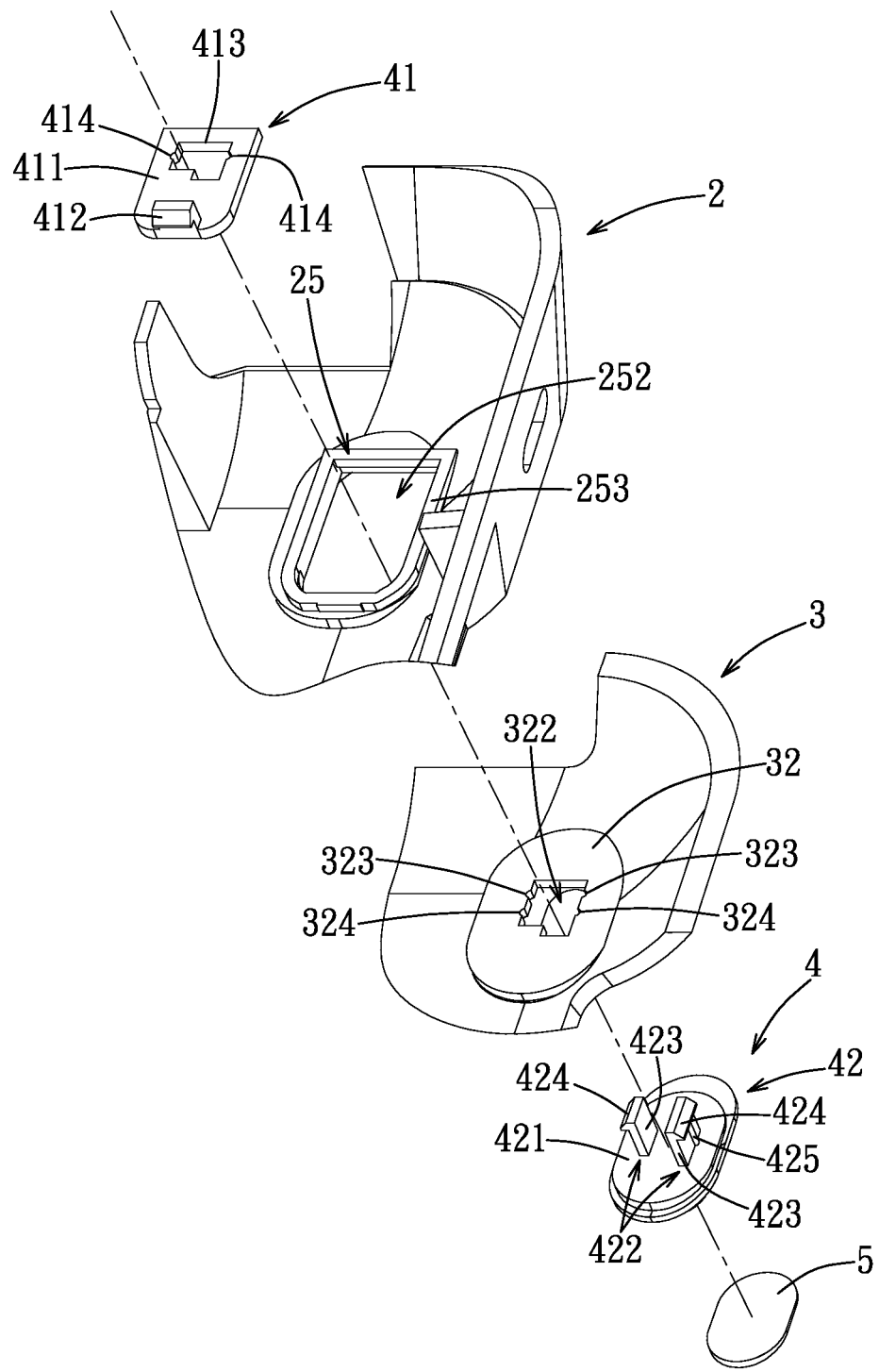
FIG. 5 is a fragmentary enlarged view of FIG. 4.
Figure 6:
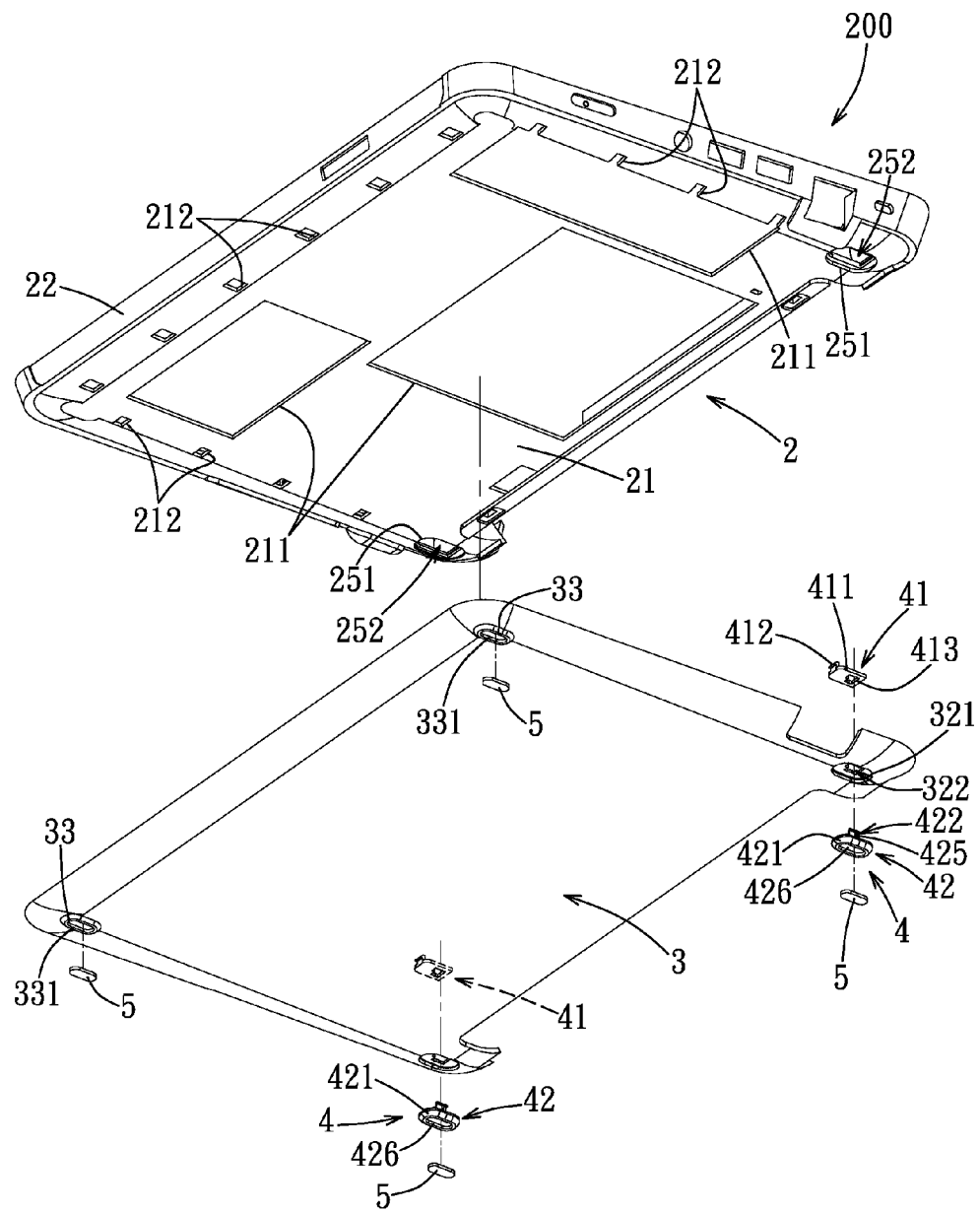
FIG. 6 is another exploded perspective view of the first preferred embodiment of the housing for an electronic device according to the present invention as viewed from another angle, illustrating the assembly relationships among the housing body, the bottom cover, and the locking members.

Referring to FIGS. 4, 5 and 6, the main technical feature of this embodiment resides in that the housing body 2 includes at least one engaging slot 212 disposed adjacent to a front end thereof, and at least one through hole 252 disposed adjacent to a rear end thereof. The bottom cover 3 includes at least one engaging hook 31 disposed adjacent to a front end thereof for engaging the engaging slot 212. At least one positioning element 253 is provided on either an inner surface of the housing body 2 or an inner surface of the bottom cover 3 adjacent to a rear end of the same. The locking member 4 extends through the through hole 252, and includes an engaging portion 412 disposed on the inner surface of the housing body 2, and a control portion 421 exposed from the through hole 252. The control portion 421 is operable to cause the engaging portion 412 to move between a locking position, where the engaging portion 412 engages the positioning element 253, and an unlocking position, where the engaging portion 412 is separated from the positioning element 253. Thus, the bottom cover 3 can be easily locked to or detached from the housing body 2.

The construction of the components of the first preferred embodiment of the present invention will be described in detail hereinbelow. The housing body 2 includes a bottom wall 21, a surrounding wall 22 extending upwardly from a periphery of the bottom wall 21, and a sidewall 23 extending upwardly from a rear side end of the bottom wall 21. The bottom wall 21, the surrounding wall 22, and the sidewall 23 cooperatively define a receiving space 24 for receiving electronic components (not shown), such as a hard disk, a memory module, etc. The bottom wall 21 is provided with a plurality of openings 211 that communicate the receiving space 24 with the ambient environment and that correspond in position to the electronic components such that the electronic components can be removed from the receiving space 24 through the respective openings 211. The bottom wall 21 is provided with a plurality of the engaging slots 212 that are spaced apart from one another and that are disposed adjacent to left, right and front sides of the bottom wall 21. The inner surface of the bottom cover 3 is provided with a plurality of the engaging hooks 31, which correspond in position to the engaging slots 212, respectively. Through the engaging hooks 31 that are engageable with the respective engaging slots 212, the bottom cover 3 can be retained on the housing body 2 and shields the openings 211 in the housing body 2.

The housing body 2 further includes two first raised walls 25 projecting upwardly from the inner surface of the bottom wall 21 and disposed respectively adjacent to rear left and right sides of the bottom wall 21. Each of the first raised walls 25 is primarily provided to define a recess 251 having a downward opening such that two second raised walls 32 of the bottom cover 3 which correspond respectively in position and shape to the recesses 251 of the first raised walls 25 are retainable in the respective recesses 251. The two second raised walls 32 project upwardly from the inner surface of the bottom cover 3. Therefore, when the second raised walls 32 are retained in the respective recesses 251, the bottom cover 3 can be retained firmly on the housing body 2 and will not slide relative to the housing body 2. Each of the first raised walls 25 further defines the through hole 252, which is in spatial communication with the corresponding recess 251. The positioning element 253 is disposed on a top end of a respective one of the first raised walls 25 of the housing body 2, and has an annular shape.

In this embodiment, there are provided two locking members 4 each including a locking plate 41 and a control button 42 coupled removably to the locking plate 41. The locking plate 41 is extendable through the through hole 252 defined by the respective first raised wall 25, and includes a plate body 411, and the engaging portion 412, which is disposed on a top face of the plate body 411 adjacent to a front end of the plate body 411, and which is configured to resemble a hook. The engaging portion 412 is engageable with the respective positioning element 253. In addition, each of the second raised walls 32 defines a mounting groove 321 which has a downward opening and a shape corresponding to that of the control portion 421 of the control button 42 to be operated by a user, and which is disposed to engage the respective control portion 421 such that the respective control portion 421 cannot move relative to the bottom cover 3 after engagement. Each of the second raised walls 32 further defines a through bore 322 in spatial communication with the mounting groove 321 thereof. The locking plate 41 further includes an engaging hole 413 disposed in the plate body 411 thereof and corresponding in position to the through bore 322 in the respective second raised wall 32. The control button 42 includes two spaced-apart positioning hooks 422 projecting from a top face of the control portion 421 thereof and disposed respectively adjacent to left and right sides of the same. The positioning hooks 422 of the control button 42 of each of the locking members 4 are disposed to extend through the respective through bore 322 in the bottom cover 3, the engaging hole 413 in the locking plate 41 of the respective locking member 4, and the respective through hole 252 in the housing body 2, and to be engaged with the plate body 411 of the locking plate 41 of the respective locking member 4 such that the control button 42 can be coupled to the locking plate 41. The control portion 421 of the control button 42 is disposed to be received in the respective mounting groove 321. The control button 42 of each of the locking members 4 is operable to bring the respective locking plate 41 to slide between an unlocking position (see FIG. 3), where the engaging portion 412 thereof is separated from the corresponding positioning element 253, and a locking position (see FIG. 11), where the engaging portion 412 thereof engages the corresponding positioning element 253.

Figure 7:
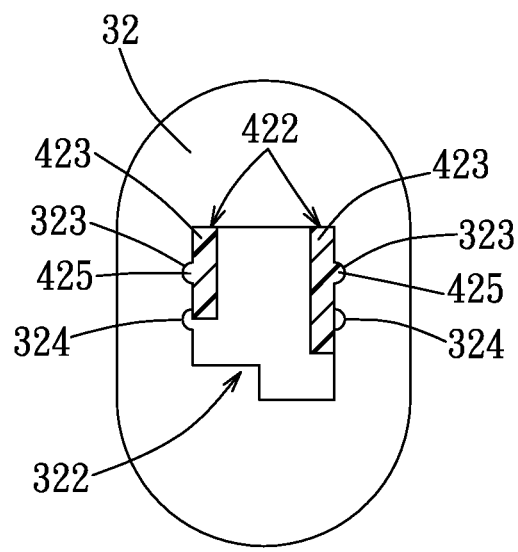
FIG. 7 is a schematic sectional view of the first preferred embodiment of the housing for an electronic device according to the present invention, illustrating limiting ribs of positioning hooks retained in first limiting indentations.
Figure 8:
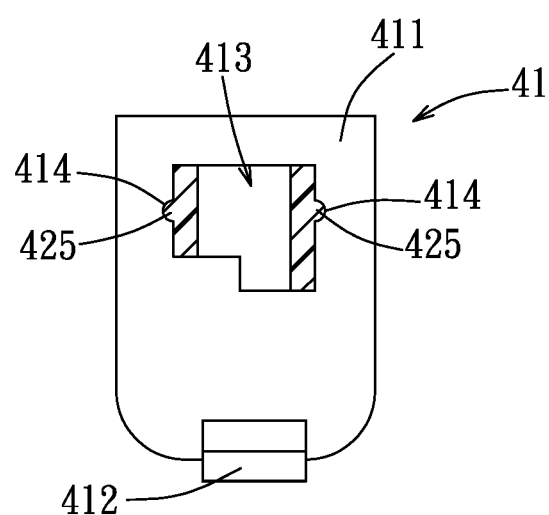
FIG. 8 is a schematic sectional view of the first preferred embodiment of the housing for an electronic device according to the present invention, illustrating the limiting ribs of the positioning hooks retained in engaging indentations.

As shown in FIGS. 5, 7 and 8, each of the second raised walls 32 of the bottom cover 3 further includes two first limiting indentations 323 disposed respectively at left and right sides and adjacent to a rear end thereof, and two second limiting indentations 324 disposed respectively in the left and right sides and adjacent to a front end thereof. The first and second limiting indentations 323, 324 of each of the second raised walls 32 are in spatial communication with the through bore 322 of the same. The locking plate 41 of each of the locking members 4 further includes two engaging indentations 414 disposed respectively in left and right sides of the plate body 411 thereof and in spatial communication with the engaging hole 413 thereof. Each of the engaging indentations 414 and the first and second limiting indentations 323, 324 has a curved shape. Each of the positioning hooks 422 includes a body portion 423 projecting from the top face of the control portion 421, a hook portion 424 formed at a top end of the body portion 423, and a longitudinally extending limiting rib 425 projecting from an outer side of the body portion 423 and connected to the hook portion 424. The limiting rib 425 of each of the positioning hooks 422 is disposed to engage a respective one of the first limiting indentations 323 and a respective one of the engaging indentations 414 of the locking plate 41, or a respective one of the second limiting indentations 324 and a respective one of the engaging indentations 414 of the locking plate 41, thereby positioning the respective locking member 4 at the unlocking or locking position.

Figure 9:
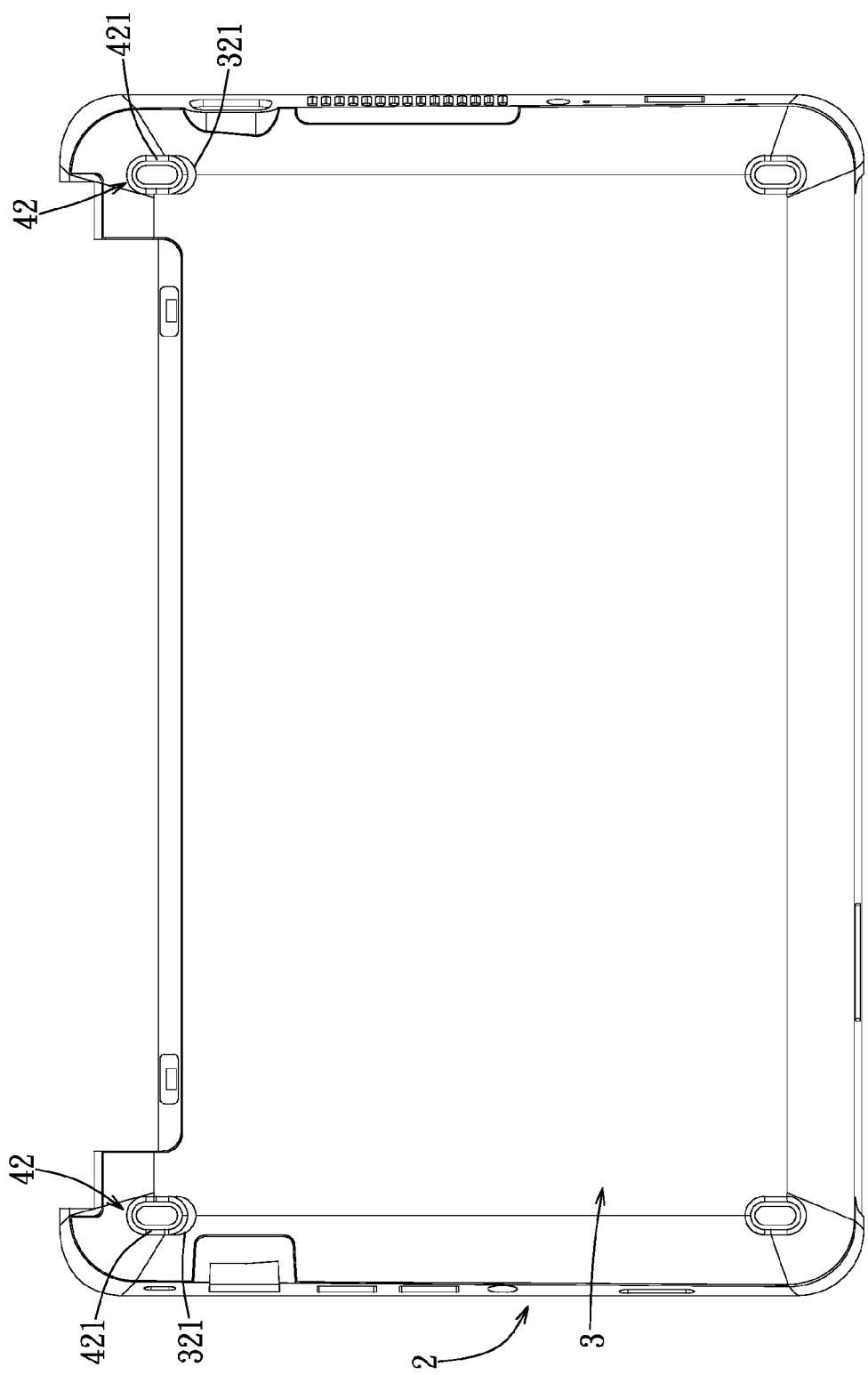
FIG. 9 is a bottom view of the first preferred embodiment of the housing for an electronic device according to the present invention, illustrating control buttons at the unlocking position.

As shown in FIGS. 3, 5 and 6, when it is desired to assemble the housing body 2, the bottom cover 3, and the locking members 4 of the housing 200, the engaging hooks 31 of the bottom cover 3 are brought into engagement with the engaging slots 212, respectively, and the second raised walls 32 of the bottom cover 3 are caused to be retained respectively in the recesses 251 of the housing body 2 so as to enable the bottom cover 3 to be retained on the housing body 2. Subsequently, the locking plates 41 of the locking members 4 are placed respectively in the through holes 252 to overlie the second raised walls 32 of the bottom cover 3, respectively. Thereafter, the positioning hooks 422 of the control button 42 of each of the locking members 4 are inserted upwardly and sequentially through the respective through bore 322 in the bottom cover 3, the respective through hole 252 in the housing body 2, and the engaging hole 413 in the respective locking plate 41 so that the hook portions 424 of the positioning hooks 422 engage the top face of the plate body 411, thereby enabling the control button 42 to be firmly coupled to both the bottom cover 3 and the locking plate 41. Assembly of the housing 200 is thus accomplished. Referring to FIGS. 7, 8 and 9, since each of the limiting ribs 425 of the positioning hooks 422 engages both the first limiting indentation 323 and the engaging indentation 414 after assembly, and since the engaging portion 412 of the locking plate 41 of each of the locking members 4 is separated from the respective positioning element 253, the engaging portion 412 of the locking plate 41 is disposed at the unlocking position shown in FIG. 3.

Figure 10:
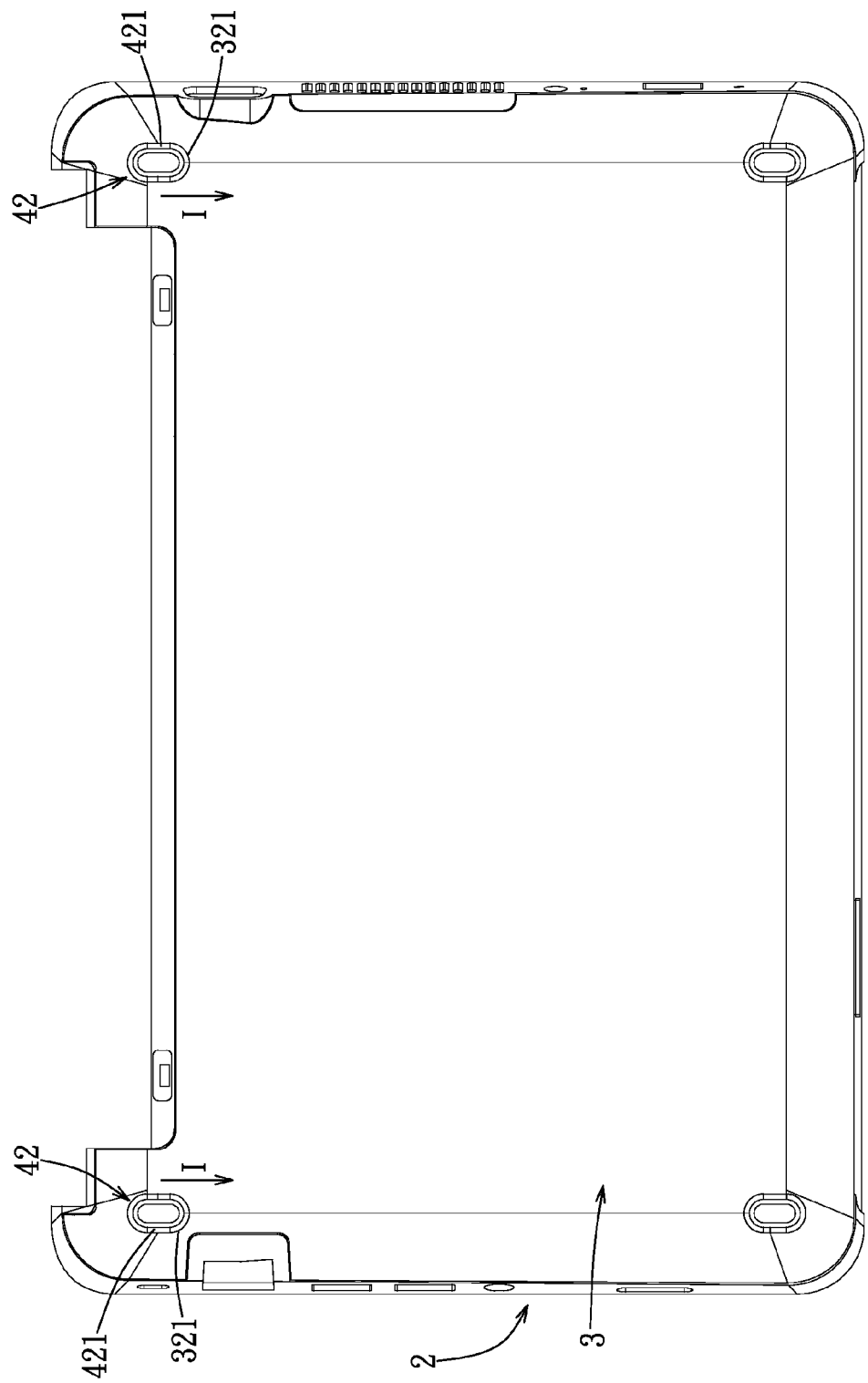
FIG. 10 is another bottom view of the first preferred embodiment of the housing for an electronic device according to the present invention, illustrating how the control buttons are pushed forward to the locking position.
Figure 11:
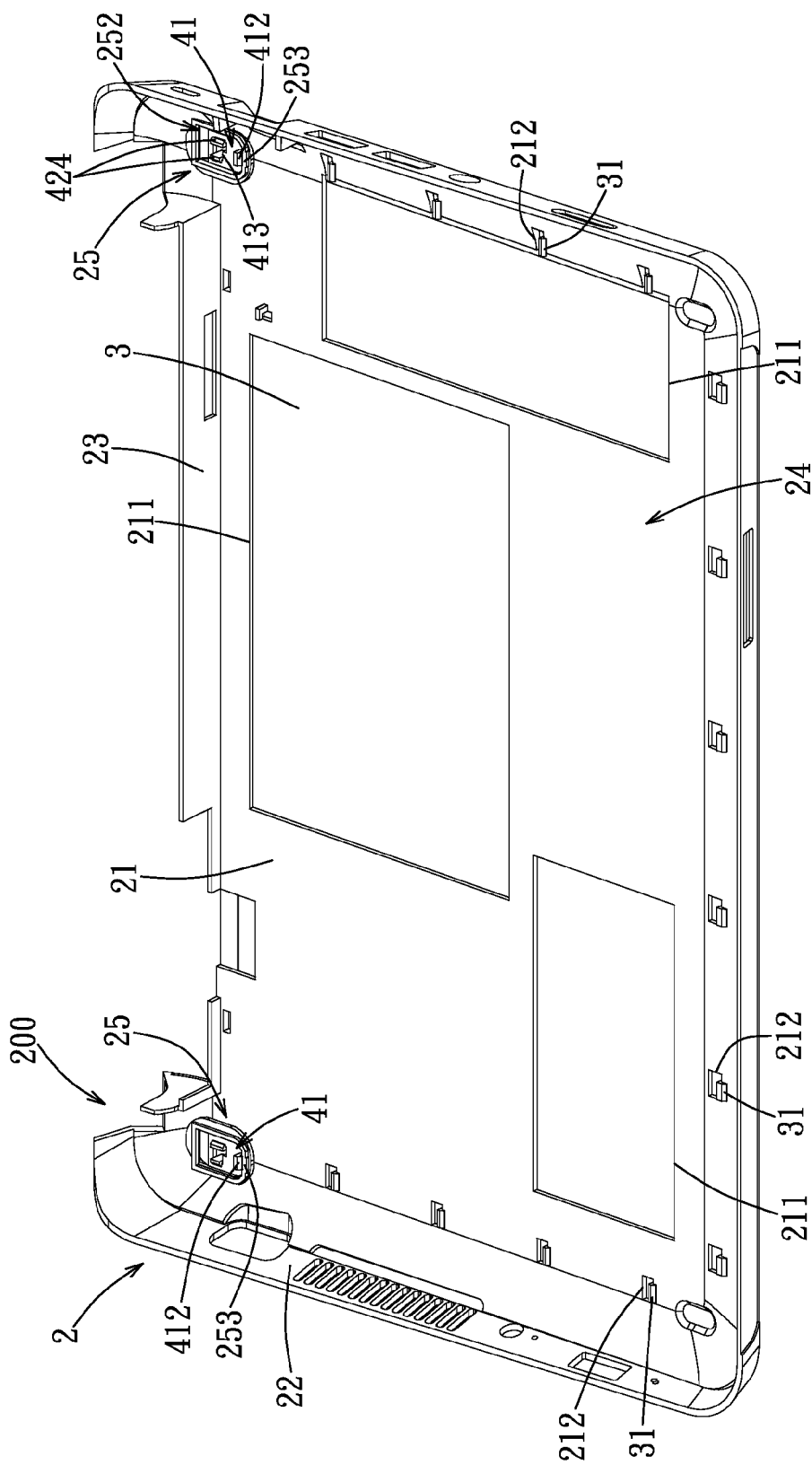
FIG. 11 is a perspective view of the first preferred embodiment of the housing for an electronic device according to the present invention, illustrating the engaging portions of the locking members in the locking position.
Figure 12:
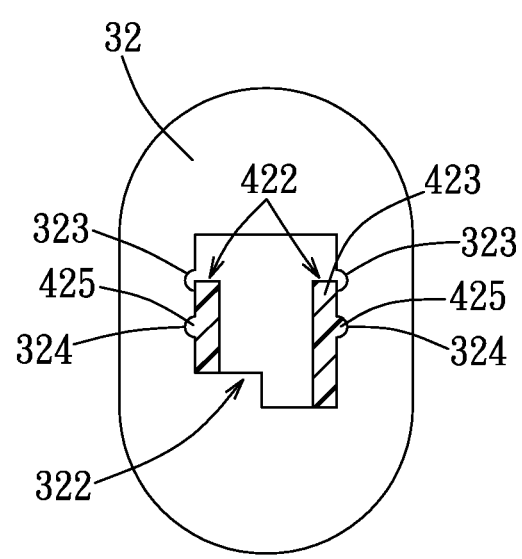
FIG. 12 is a schematic sectional view of the first preferred embodiment of the housing for an electronic device according to the present invention, illustrating the limiting ribs of the positioning hooks retained in second limiting indentations.

As shown in FIGS. 10, 11 and 12, when it is desired to lock the bottom cover 3 to the housing body 2, the user may push the control portion 421 of the control button 42 of each of the locking members 4 forwardly in a direction indicated by the arrow (I) (see FIG. 10) such that the limiting ribs 425 of the positioning hooks 422 of the respective locking member 4 are disengaged from the respective first limiting indentations 323. After the control portion 421 of the control button 42 of each of the locking members 4 is fully engaged with the respective mounting groove 321, the engaging portion 412 of the locking plate 41 engages a front side of the respective positioning element 253, and the limiting ribs 425 of the positioning hooks 422 of the respective locking member 4 engage the respective second limiting indentations 324, whereby the locking plates 41 of the locking members 4 can be firmly disposed at the locking position shown in FIG. 11 to place the bottom cover 3 and the housing body 2 in a locked state.

Since the bottom cover 3 of this embodiment may be used as a decorative plate, if the user intends to replace the bottom cover 3 with one of a different design (e.g., of a different color or having a different pattern), the control portion 421 of the control button 42 of each of the locking members 4 can be pushed rearwardly in a direction opposite to that indicated by the arrow (I). After the limiting ribs 425 of the positioning hooks 422 of each of the locking members 4 are restored to the positions where they once again engage the respective first limiting indentations 323, the engaging portion 412 of the locking plate 41 of each of the locking members 4 is completely separated from the respective positioning element 253, so that the bottom cover 3 and the housing body 2 are placed in an unlocked state. Subsequently, the hook portions 424 of the two positioning hooks 422 of the control button 42 of each of the locking members 4 are pressed inward simultaneously to cause the hook portions 424 to disengage from the top face of the plate body 411 of the respective locking plate 41, at which time the control button 42 of each of the locking members 4 may be pulled downward to cause the two positioning hooks 422 thereof to disengage from the engaging hole 413 (see FIG. 5) of the respective locking plate 41 and from the respective through bore 322 in the bottom cover 3. Finally, each of the engaging hooks 31 of the bottom cover 3 is separated from the respective engaging slot 212 of the housing body 2 to thereby accomplish detachment of the bottom cover 3. Thus, the user may change the bottom cover 3 with ones of different designs as needed. By virtue of the two-piece construction of each of the locking members 4, i.e., the locking plate 41 and the control button 42 coupled detachably to the locking plate 41, the user can easily manipulate the control portion 421 of the control button 42 from the exterior of the bottom cover 3 to cause the locking plate 41 disposed in the through hole 252 in the housing body 2 to slide with the control portion 421. Furthermore, due to easy assembly and disassembly between the locking plate 41 and the control button 42, each of the locking members 4 can be quickly assembled to the housing body 2 and the bottom cover 3 for a locking or unlocking operation. Moreover, the locking members 4 can be quickly detached from the housing body 2 and the bottom cover 3 for replacement of the bottom cover 3.

As shown in FIGS. 5 and 6, in this embodiment, the control portions 421 of the control buttons 42 have the same profile as that of support legs 33 which are disposed on an outer surface of the bottom cover 3 adjacent to the front end of the same, so that the control portions 421 can be used as the support legs 33. The control portions 421 and the support legs 33 are each provided with a receiving groove 426, 331 having a downward opening. Each receiving groove 426, 331 is disposed to retain a rubber element 5. Thus, when the housing 200 is placed on a planar surface (not shown), through the rubber elements 5 that abut against the planar surface, the housing 200 can be positioned firmly on the planar surface and is not susceptible to wobbling under the influence of an external force. It is particularly noted that, although the locking members 4 in this embodiment are exemplified to be two in number, in practice, there may be provided only one locking member 4, with a support leg 33 substituting the other locking member 4, and the same effect of locking the bottom cover 3 to the housing body 2 can still be achieved. However, use of two locking members 4 as disclosed in this embodiment can lock the bottom cover 3 onto the housing body 2 more securely.

Figure 13:
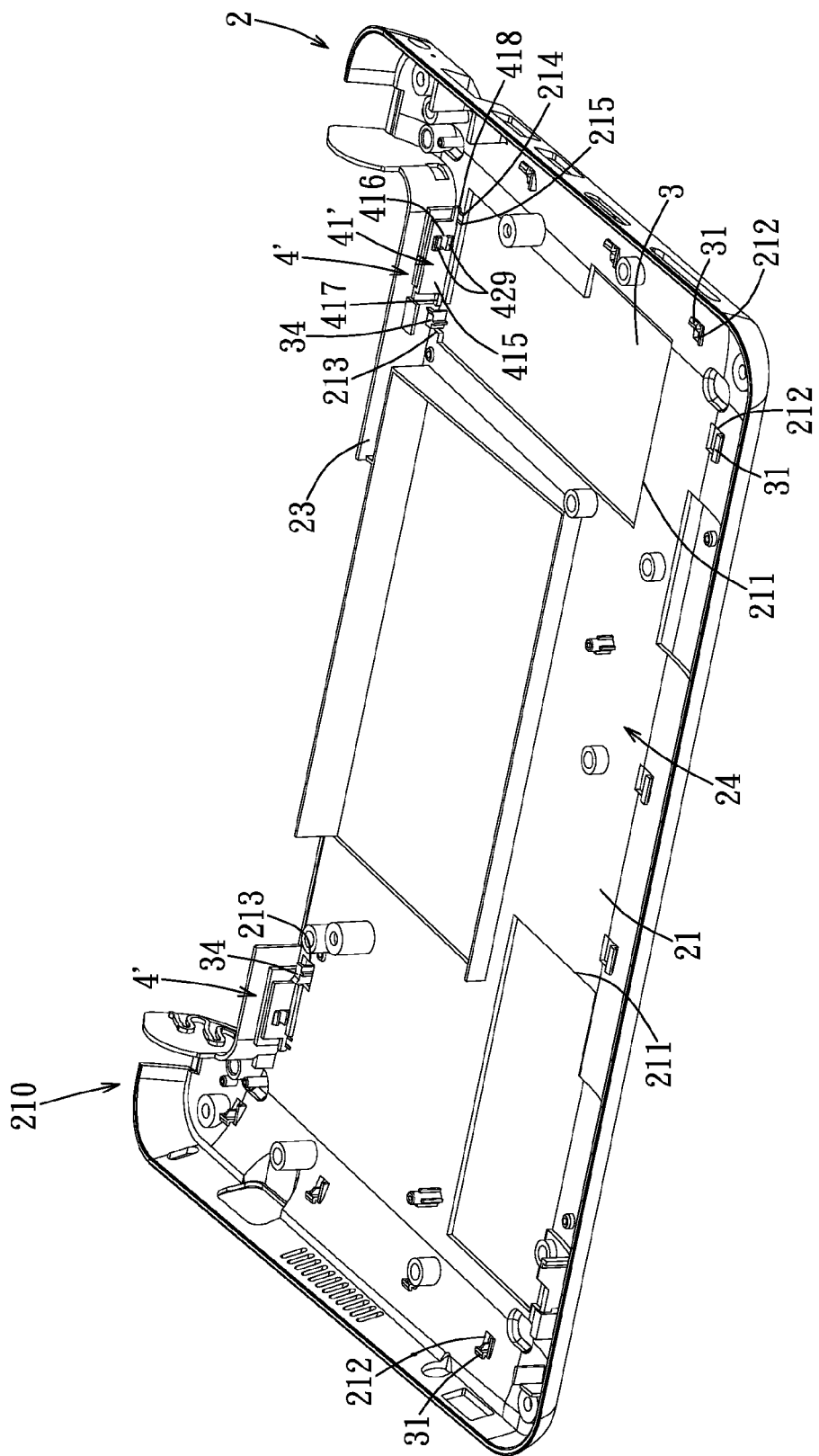
FIG. 13 is a perspective view of the first preferred embodiment of the housing for an electronic device according to the present invention, illustrating the engaging portions of the locking members in the unlocking position.
Figure 14:
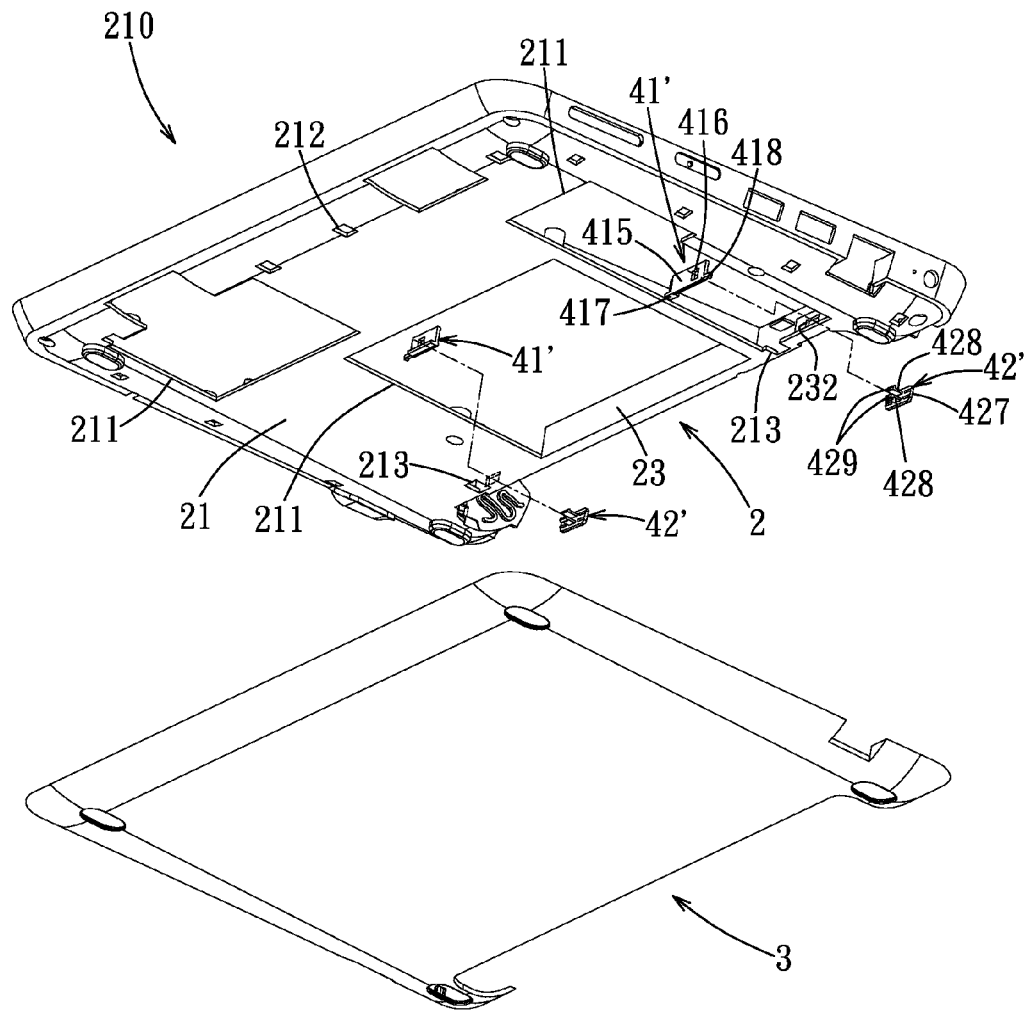
FIG. 14 is an exploded perspective view of the second preferred embodiment of the housing for an electronic device according to the present invention, illustrating the assembly relationships among a housing body, a bottom cover, and locking members.
Figure 15:
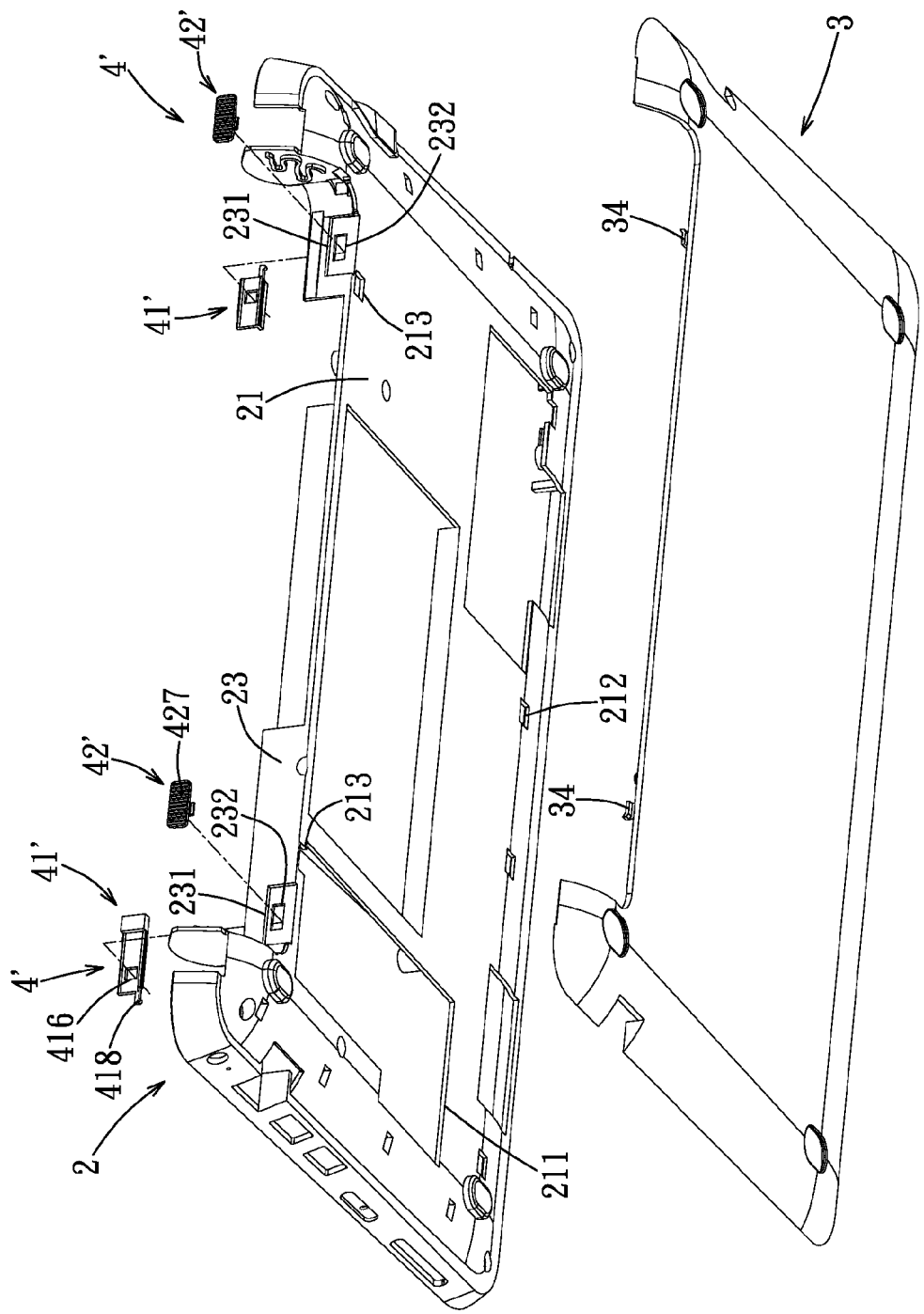
FIG. 15 is another exploded perspective view of the second preferred embodiment of the housing for an electronic device according to the present invention as viewed from another angle, illustrating the assembly relationships among the housing body, the bottom cover, and the locking members.

Referring to FIGS. 13, 14 and 15, the second preferred embodiment of a housing 210 for an electronic device according to the present invention is substantially the same as the first preferred embodiment in overall construction. The difference resides in the configuration and positions of the locking members 4'.

The bottom cover 3 is provided with two positioning elements 34 that are respectively disposed on the left and right sides of the inner surface of the bottom cover 3 adjacent to the rear end thereof. Each of the positioning elements 34 has an inverted L-shape. The bottom wall 21 of the housing body 2 is provided with two apertures 213 that correspond respectively to the positioning elements 34 in position. When the engaging hooks 31 of the bottom cover 3 are respectively engaged with the engaging slots 212 of the housing body 2, the positioning elements 34 will extend through the respective apertures 213. The sidewall 23 of the housing body 2 defines two rectangular slide grooves 231 that are disposed on left and right sides thereof, and two through holes 232 that are in spatial communication with the slide grooves 231, respectively. The plate body 415 of the locking plate 41' of each of the locking members 4' defines an engaging hole 416 that corresponds in position to the respective through hole 232, and has one end provided with an engaging portion 417 for engaging the respective positioning element 34, and the other end provided with a limiting hook 418 for engaging either a first limiting block 214 projecting from an inner wall surface of the bottom wall 21 or a second limiting block 215 projecting from the inner wall surface of the bottom wall 21. The second limiting block 215 is disposed between a respective one of the positioning elements 34 and a respective one of the first limiting blocks 214. Thus, the locking plates 41' of the locking members 4 can be positioned at the unlocking position or the locking position.

Figure 16:
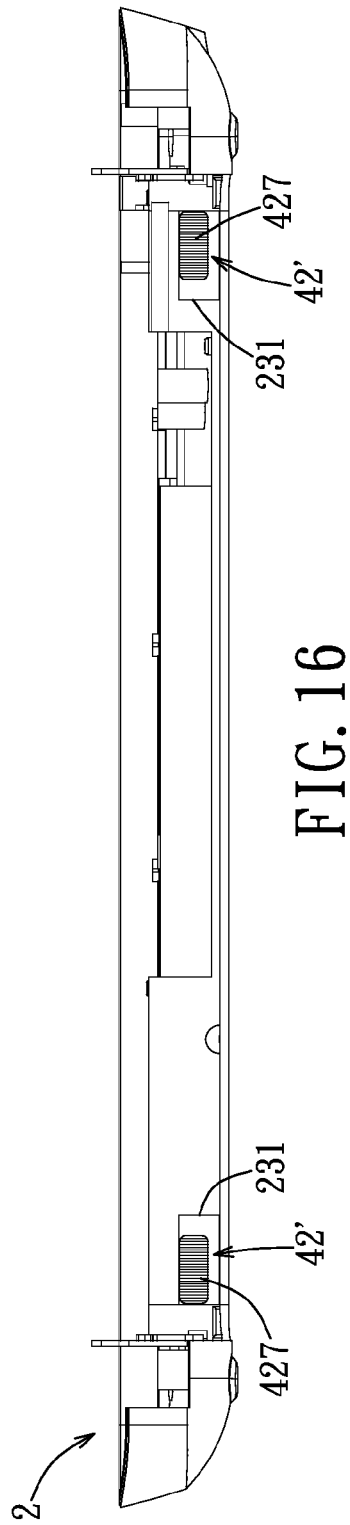
FIG. 16 is a side view of the second preferred embodiment of the housing for an electronic device according to the present invention, illustrating control buttons at an unlocking position.

The control button 42' of each of the locking members 4' includes a substantially rectangular control portion 427, and two positioning hooks 428 projecting from a front side of the control portion 427. When it is desired to assemble the locking members 4' to the housing body 2, the locking plates 41' are placed on the bottom wall 21 and the engaging holes 416 are respectively aligned with the through holes 232. Subsequently, the two positioning hooks 428 of each of the locking members 4' are inserted into the respective through hole 232 and the respective engaging hole 416 such that hook portions 429 of the two positioning hooks 428 engage a front side face of the plate body 415 of the respective locking plate 41', thereby accomplishing assembly of the locking members 4'. At this time, the limiting hook 418 of the locking plate 41' of each of the locking members 4 engages an outer side of the respective first limiting block 214, and the control portion 427 of the control button 42' abuts against an outer end of the slide groove 231 as shown in FIG. 16.

Figure 17:
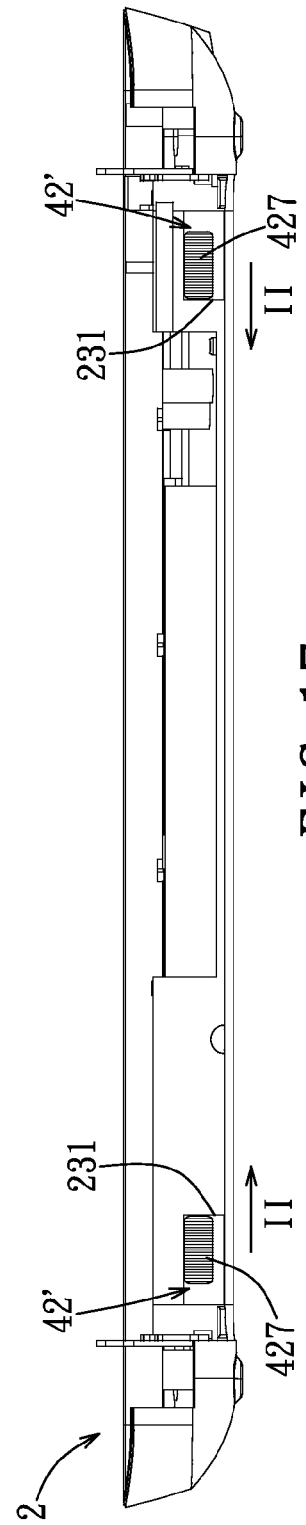
FIG. 17 is a side view of the second preferred embodiment of the housing for an electronic device according to the present invention, illustrating the control buttons at a locking position.
Figure 18:
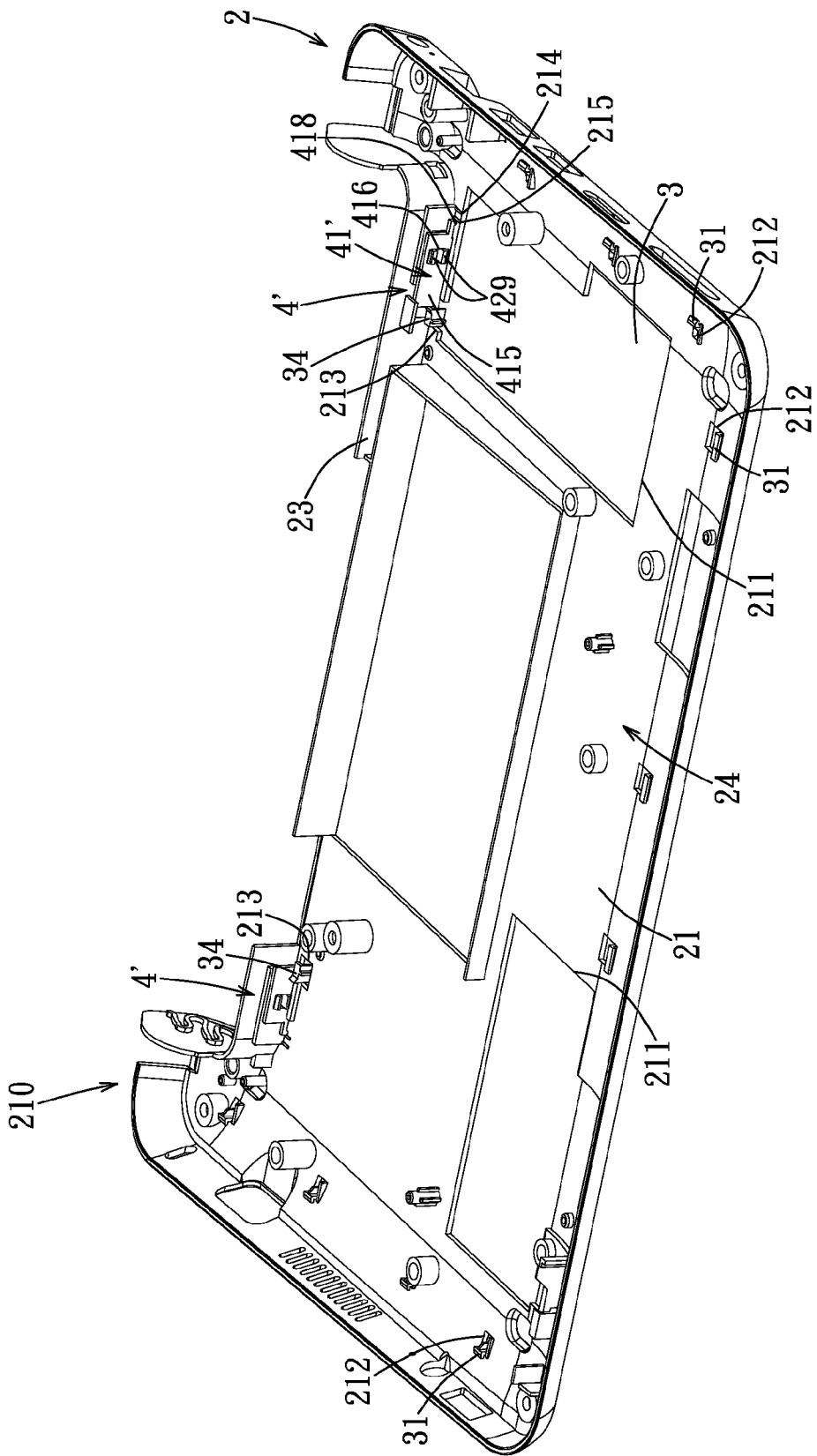
FIG. 18 is a perspective view of the second preferred embodiment of the housing for an electronic device according to the present invention, illustrating engaging portions of the locking members in the locking position.

Referring to FIGS. 13, 17 and 18, when it is desired to lock the bottom cover 3 to the housing body 2, the engaging hooks 31 of the bottom cover 3 are first brought into engagement with the engaging slots 212 of the housing body 2. At this time, the positioning elements 34 of the bottom cover 3 will extend through the respective apertures 213 in the housing body 2. Subsequently, the user can push the control portion 427 of the control button 42' of each of the locking members 4' inwardly in a direction indicated by the arrow (II) (see FIG. 17). The control button 42' will cause the respective locking plate 41' to slide such that the limiting hook 418 is disengaged from the respective first limiting block 214. When the control portion 427 sliding along the slide groove 231 abuts against an inner end of the slide groove 231 (as shown in FIG. 17), the engaging portion 417 of the locking plate 41' will be engaged with the respective positioning element 34 of the bottom cover 3, and the limiting hook 418 of the locking plate 41' will engage an inner side of the second limiting block 215. Thus, the locking members 4' can be positioned firmly at the locking position. At this time, the bottom cover 3 and the housing body 2 are in a locked state.

When it is desired to detach the bottom cover 3 from the housing body 2, the user can push the control portion 427 of the control button 42' outwardly in a direction opposite to that indicated by the arrow (II) so as to cause the engaging portion 417 of the locking plate 41' to disengage from the positioning element 34. When the control portion 427 abuts against the outer end of the slide groove 231 as shown in FIG. 16, the engaging portion 417 is completely disengaged from the positioning element 34, and the positioning hook 418 engages the outer side of the first limiting block 214. At this time, the locking members 4' are restored to the unlocking position. Thereafter, the engaging hooks 31 of the bottom cover 3 are respectively separated from the engaging slots 212 of the housing body 2 to thereby detach the bottom cover 3 from the housing body 2. By virtue of the two-piece construction of each of the locking members 4', i.e., the locking plate 41' and the control button 42' coupled detachably to the locking plate 41', the user can easily manipulate the control portion 427 of the control button 42' from the exterior of the housing body 2 to cause the locking plate 41' disposed in the sidewall 213 of the housing body 2 to slide with the control portion 427.

Figure 19:
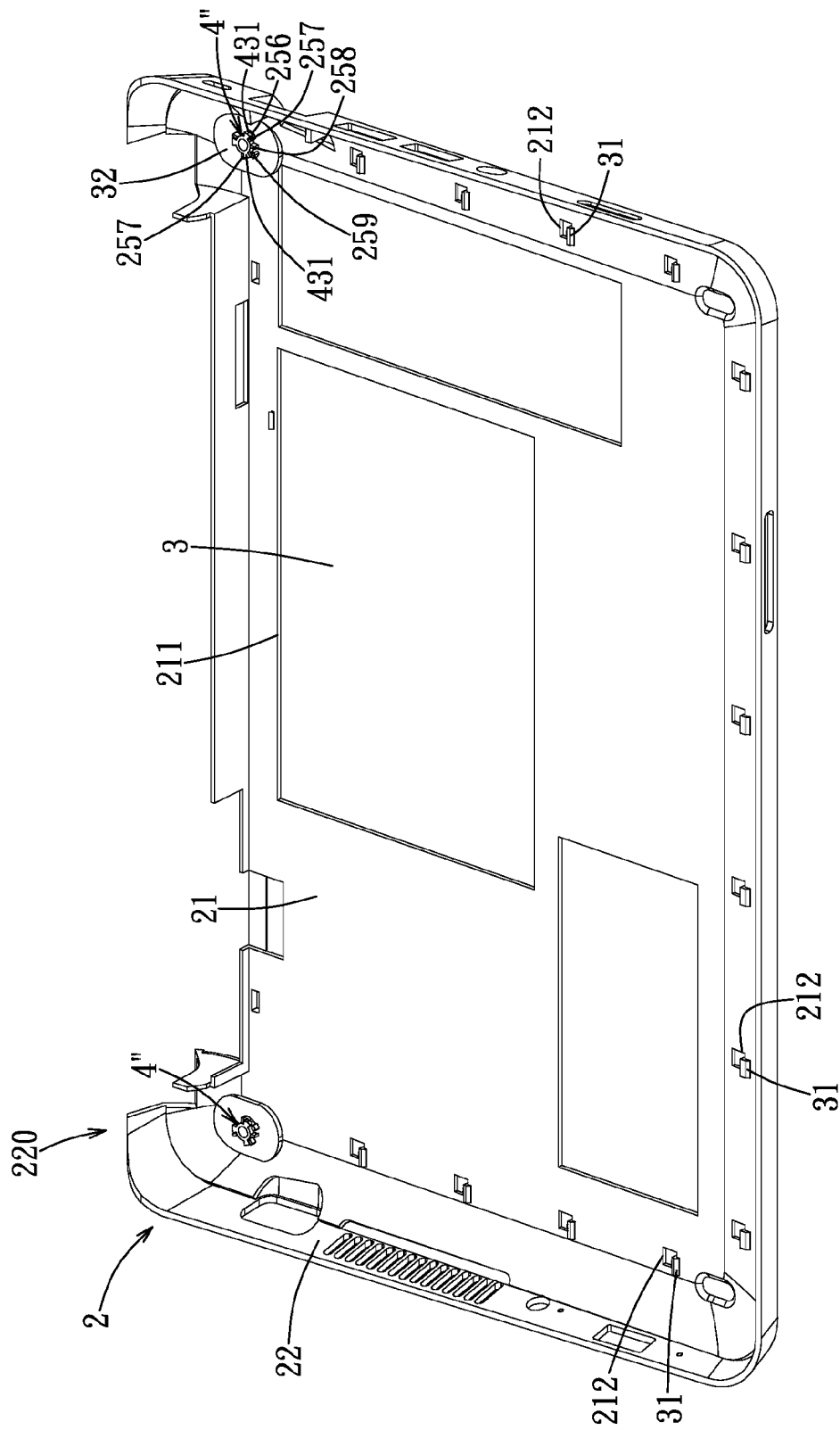
FIG. 19 is a perspective view of the third preferred embodiment of the housing for an electronic device according to the present invention, illustrating engaging portions of locking members in an unlocking position.

Referring to FIG. 19, the third preferred embodiment of a housing 220 for an electronic device according to the present invention is substantially the same as that of the first preferred embodiment in overall construction. The difference resides in the configuration of the locking members 4".

Figure 20:
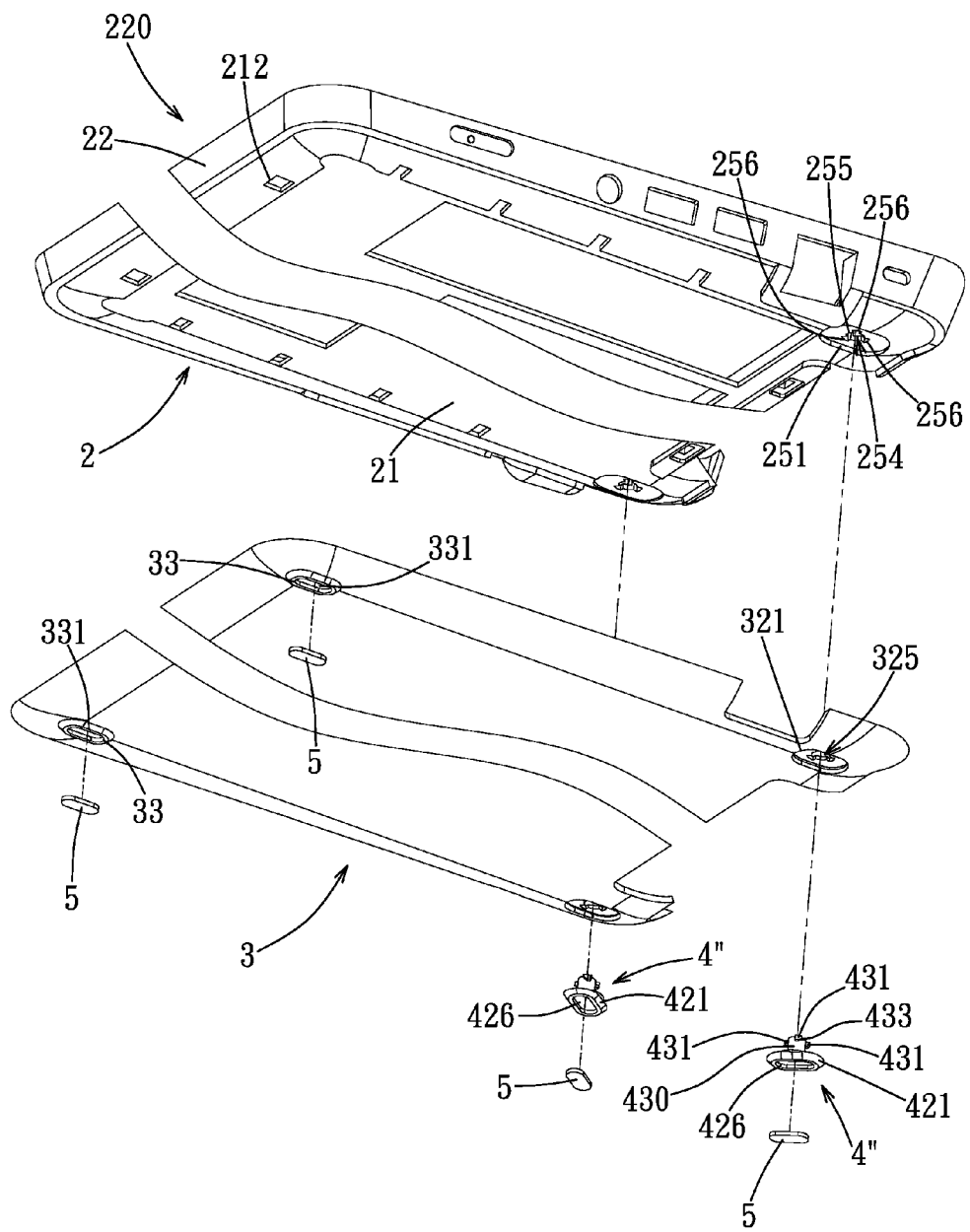
FIG. 20 is a fragmentary exploded perspective view of the third preferred embodiment of the housing for an electronic device according to the present invention, illustrating the assembly relationships among a housing body, a bottom cover, and locking members.
Figure 21:
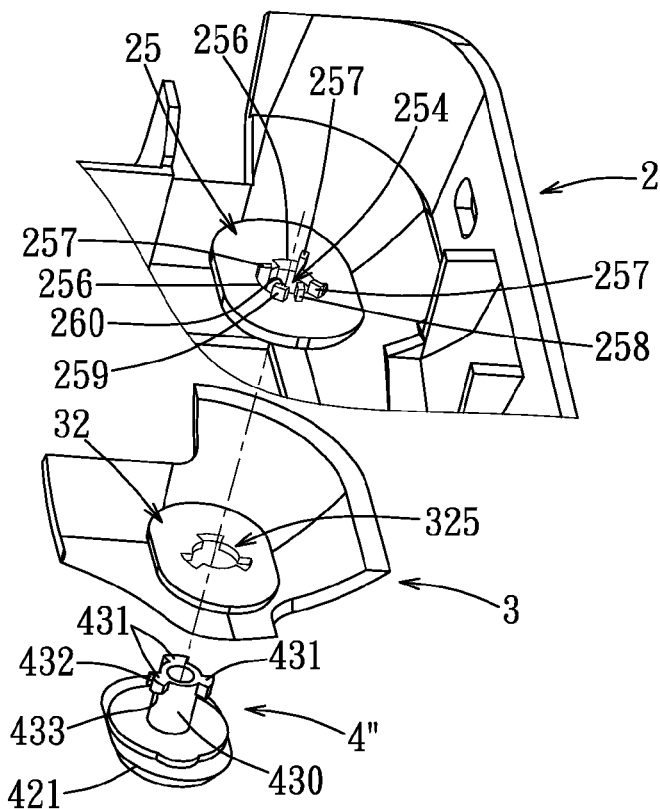
FIG. 21 is another fragmentary exploded perspective view of the third preferred embodiment of the housing for an electronic device according to the present invention, illustrating the assembly relationships among the housing body, the bottom cover, and the locking member.
Figure 22:
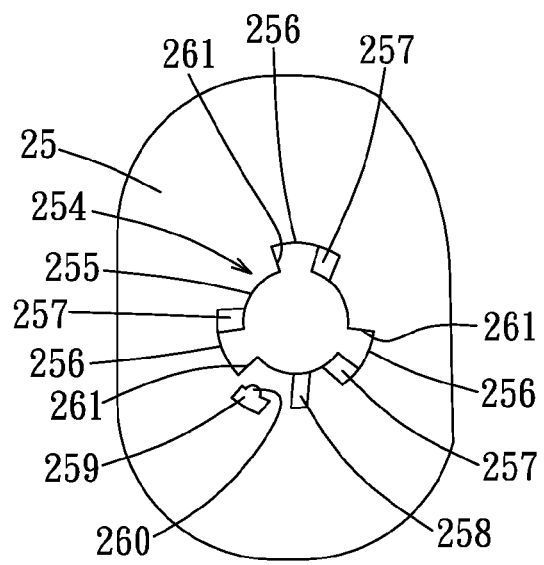
FIG. 22 is a fragmentary enlarged view of the housing body of the third preferred embodiment of the housing for an electronic device according to the present invention.
Figure 23:
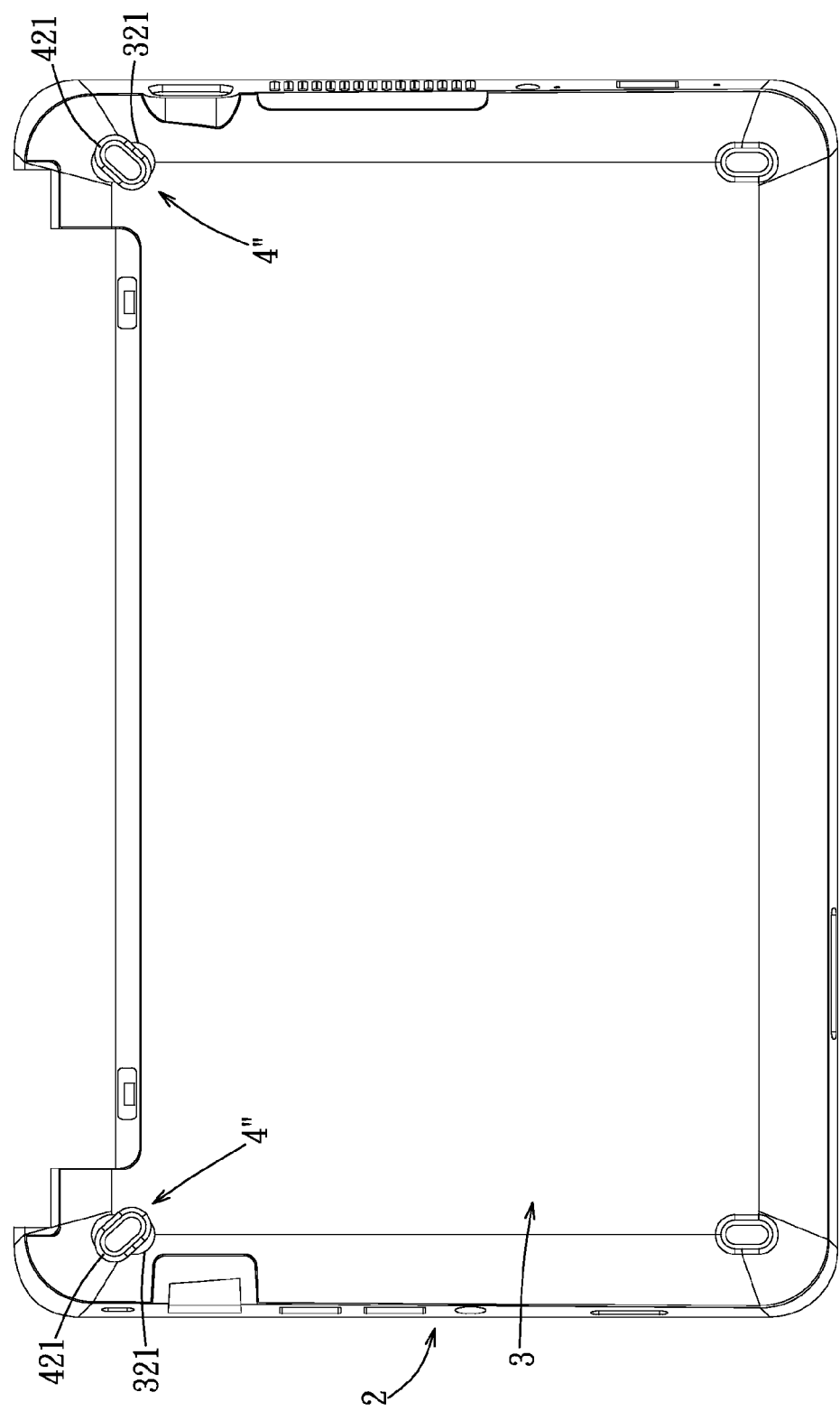
FIG. 23 is a bottom view of the third preferred embodiment of the housing for an electronic device according to the present invention, illustrating the locking member in the unlocking position.
Figure 24:
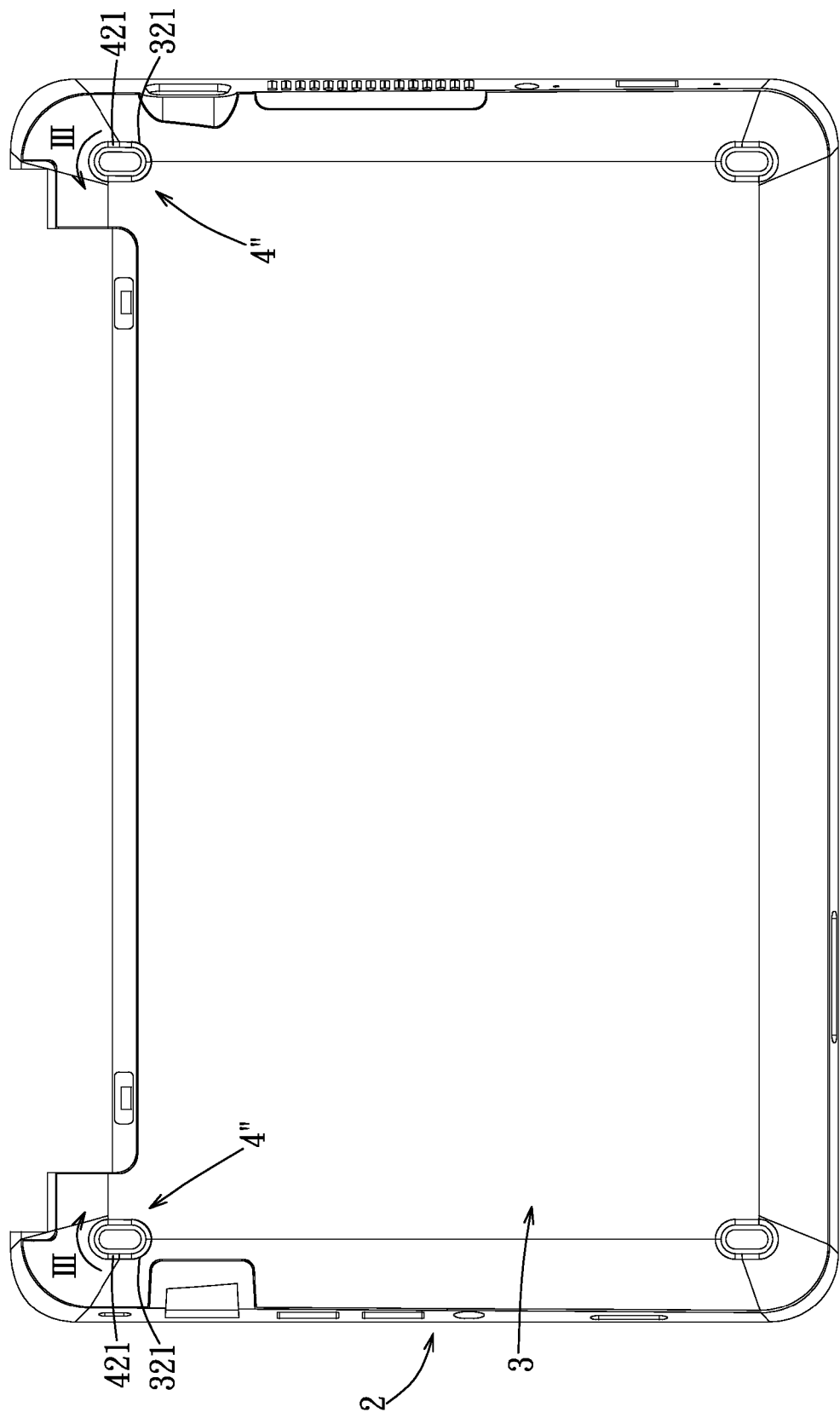
FIG. 24 is another bottom view of the third preferred embodiment of the housing for an electronic device according to the present invention, illustrating the locking member in a locking position.
Figure 25:
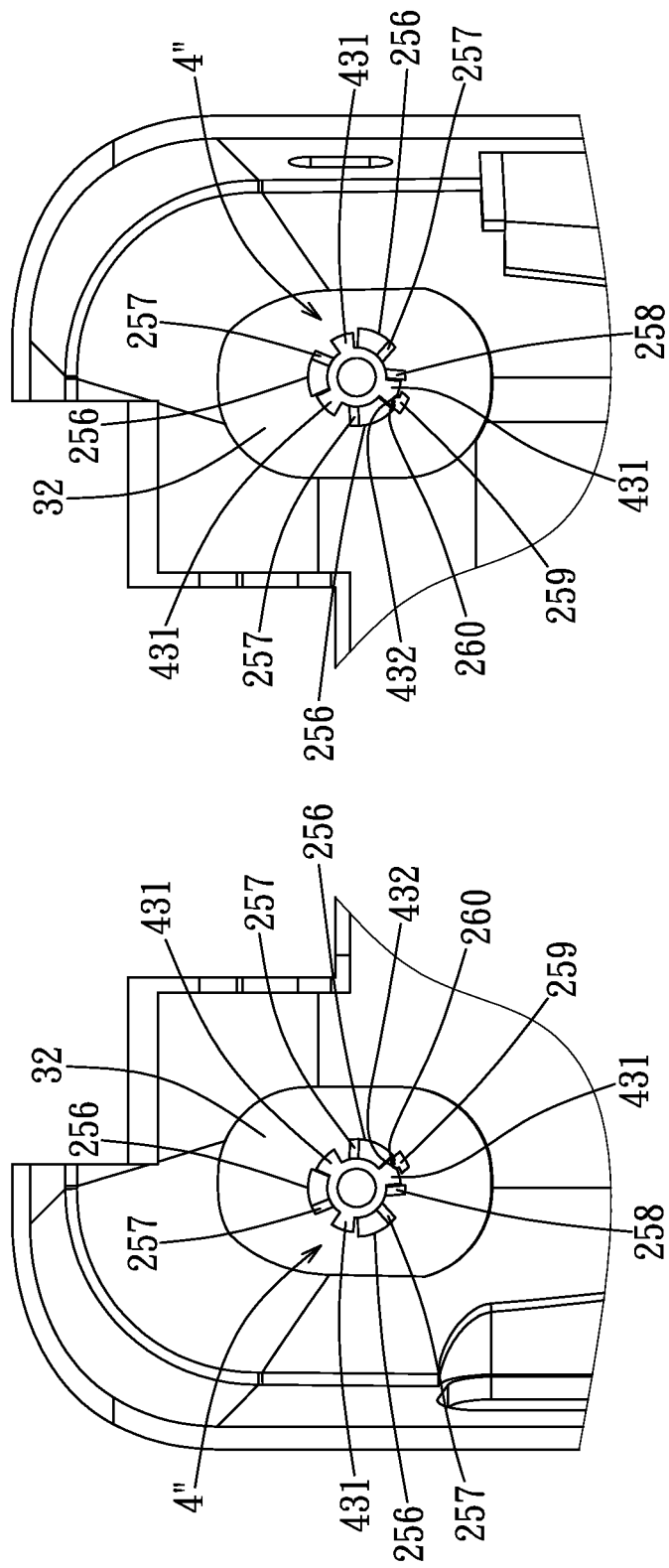
FIG. 25 is a fragmentary enlarged view of the third preferred embodiment of the housing for an electronic device according to the present invention, illustrating engaging portions of the locking members in the locking position.

Referring to FIGS. 20, 21 and 22, each of the first raised walls 25 of the housing body 2 defines a through hole 254 in spatial communication with the respective recess 251. The through hole 254 has a first hole portion 255 and a plurality of second hole portions 256 disposed at an outer periphery of the first hole portion 255. Each of the second raised walls 32 of the bottom cover 3 defines a through bore 325 in spatial communication with the respective mounting groove 321. The through bore 325 corresponds in position to the through hole 254, and has the same shape as the through hole 254. Each of the locking members 4" includes a control portion 421, a post 430 projecting from the top face of the control portion 421, and a plurality of engaging portions 431 disposed on an outer surface and adjacent to a top end of the post 430 and angularly displaced from one another. The post 430 and the engaging portions 431 of each of the locking members 4" can extend through the respective through bore 325 and the first and second hole portions 255, 256 of the respective through hole 254, with the engaging portions 431 exposed from the second hole portions 256, respectively. Thus, after the control portion 421 is rotated a suitable angle, the engaging portions 431 of each of the locking members 4" can be brought into engagement with a top face of the respective first raised wall 25. The top face of each of the first raised walls 25 is provided with a plurality of stop elements 257, each of which is disposed adjacent to one side of a respective one of the second hole portions 256 for abutting against a respective one of the engaging portions 431 to thereby limit the rotating direction of the engaging portions 431 of the respective locking member 4". The top face of each of the first raised walls 25 is further provided with a limiting element 258 disposed between two of the stop elements 257, and a positioning element 259 disposed between the limiting element 258 and the corresponding stop element 257. The positioning element 259 includes an engaging block 260 facing toward the first hole portion 255. One of the engaging portions 431 of each of the locking members 4" can abut against the positioning element 258 to thereby limit the rotating angle of the respective locking member 4" and enable an engaging indentation 432 in said one of the engaging portions 431 to engage the engaging block 260 of the positioning element 259.

Referring to FIGS. 20, 23, 24, and 25, when it is desired to lock the bottom cover 3 to the housing 2, the engaging hooks 31 of the bottom cover 3 are respectively brought into engagement with the engaging slots 212, and the second raised walls 32 of the bottom cover 3 are respectively brought into engagement with the recesses 251 in the housing body 2, thereby retaining the bottom cover 3 on the housing body 2. Subsequently, the post 430 and the engaging portions 431 of each of the locking members 4" are passed through the through bore 325 and the through hole 254 such that the engaging portions 431 are exposed from the second hole portions 256 of the through hole 254. Thereafter, the user may rotate the control portion 421 of each of the locking members 4" in a direction indicated by the arrow (III) (see FIG. 24). Since each of the engaging portions 431 has a guiding sloping surface 433 for contacting an edge 261 (see FIG. 22) of a respective one of the second hole portions 256 of the through hole 254, even if the engaging portions 431 are not fully exposed from top ends of the respective second hole portions 256, the engaging portions 431 of each of the locking members 4" may still be rotated to the top face of the respective first raised wall 25 by virtue of the guidance of the guiding sloping surface 433. After the control portion 421 of each of the locking members 4" is rotated to be completely within the respective mounting groove 321, one of the engaging portions 431 will abut against the limiting element 258 of the respective first raised wall 25 so that the respective locking member 4" can be rotated no further, and the engaging indentation 432 of said one of the engaging portions 431 will engage the engaging block 260 of the positioning element 259. At this time, the locking members 4" are disposed at the locking position to thereby place the bottom cover 3 and the housing body 2 in a locked state. It is noted that each of the locking members 4" may be configured to have only one engaging portion 431, which has the engaging indentation 432, and may still achieve the effect of engaging the top face of the first raised wall 25 and the positioning element 259.

When it is desired to detach the bottom cover 3 from the housing body 2, the user may rotate the control portion 421 of each of the locking members 4" in a direction opposite to that indicated by the arrow (III) to cause the engaging indentation 432 of said one of the engaging portions 431 to disengage from the engaging block 260. When each of the engaging portions 431 of each of the locking members 4" is rotated to a position where it is registered with the respective second hole portion 256, the respective locking member 4" can be pulled downward to cause the post 430 and the engaging portions 431 thereof to disengage from the respective through hole 254 and the respective through bore 325. Subsequently, the engaging hooks 31 of the bottom cover 3 are respectively disengaged from the engaging slots 212 to thereby detach the bottom cover 3 from the housing body 2.

In summary, in each of the above-described embodiments, by means of the locking members 4, 4', 4" that are movable between the locking position and the unlocking position by sliding or rotating, the bottom cover 3 can be assembled and locked to the housing body 2 or detached from the housing body 2 with relative ease. Thus, the present invention provides a screwless locking structure that not only enhances assembly and disassembly convenience but also reduces disassembly time.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A housing for an electronic device, comprising:
   a housing body including an engaging slot disposed adjacent to a front end thereof, and a through hole disposed adjacent to a rear end thereof, said housing body having an inner surface provided with a positioning element that is disposed adjacent to said through hole;
   a bottom cover including an engaging hook disposed adjacent to a front end thereof for engaging said engaging slot, and a through bore disposed adjacent to a rear end thereof and corresponding in position to said through hole; and a locking member extending through said through bore and said through hole, and including an engaging portion disposed on said inner surface of said housing body, and a control portion exposed from an outer surface of said bottom cover, said control portion being operable to cause said engaging portion to move between a locking position where said engaging portion engages said positioning element and an unlocking position where said engaging portion is separated from said positioning element;

wherein said locking member further includes a post projecting from said control portion and extending through said through bore and said through hole, said engaging portion being formed on an outer surface of said post and being exposed from said through hole, said control portion being disposed on said outer surface of said bottom cover and being operable to cause said engaging portion to rotate between said locking position and said unlocking position;

wherein said control portion is provided with a receiving groove having a downward opening, said housing further comprising a rubber element retained in said receiving groove for abutting against a planar surface;

wherein said positioning element includes an engaging block, said engaging portion including an engaging indentation for engaging said engaging block; and wherein said inner surface of said housing body is further provided with a limiting element for abutment by said engaging portion so as to limit a rotational angle of said engaging portion.

2. The housing for an electronic device of claim 1, wherein said inner surface of said housing body is further provided with a stop element that is spaced apart from said limiting element for abutment by said engaging portion, said stop element serving to limit a rotational direction of said engaging portion.

3. The housing for an electronic device of claim 2, wherein said engaging portion further includes a guiding sloping surface for contacting an edge of said through hole.

* * * * *